United States Patent
Jeong

(10) Patent No.: US 10,386,713 B2
(45) Date of Patent: Aug. 20, 2019

(54) METHOD OF PROVIDING INITIAL BIAS VALUE FOR OPTICAL PROXIMITY CORRECTION, AND MASK FABRICATING METHOD WITH OPTICAL PROXIMITY CORRECTION BASED ON THE INITIAL BIAS VALUE

(71) Applicant: SAMSUNG ELECTRONICS CO., LTD., Suwon-si, Gyeonggi-do (KR)

(72) Inventor: Moon-Gyu Jeong, Gwangmyeong-si (KR)

(73) Assignee: SAMSUNG ELECTRONICS CO., LTD., Suwon-si, Gyeonggi-do (KR)

(*) Notice: Subject to any disclaimer, the term of this patent is extended or adjusted under 35 U.S.C. 154(b) by 269 days.

(21) Appl. No.: 15/198,187

(22) Filed: Jun. 30, 2016

(65) Prior Publication Data

US 2017/0038674 A1    Feb. 9, 2017

(30) Foreign Application Priority Data

Aug. 3, 2015 (KR) .................... 10-2015-0109527

(51) Int. Cl.
*G03F 1/36* (2012.01)

(52) U.S. Cl.
CPC .................... *G03F 1/36* (2013.01)

(58) Field of Classification Search
CPC .......... G03F 1/36; G03F 1/70; G03F 7/70441; G03F 7/70125; G03F 7/70425; G03F 1/72; G03F 7/70283; G03F 7/70433; G03F 7/70466; G03F 7/705; G06F 17/5081; G06F 2217/12
See application file for complete search history.

(56) References Cited

U.S. PATENT DOCUMENTS 5,879,844 A * 3/1999 Yamamoto .............. G03F 1/36
430/296
7,247,574 B2 7/2007 Broeke et al.
(Continued)

FOREIGN PATENT DOCUMENTS

KR  10-2004-0065188 A  7/2004
KR  10-2009-0042456 A  4/2009

OTHER PUBLICATIONS

Cobb, "Sum of Coherent Systems Decomposition by SVD", Sep. 21, 1995.

(Continued)

*Primary Examiner* — Nha T Nguyen
(74) *Attorney, Agent, or Firm* — Lee & Morse, P.C.

(57) ABSTRACT

A method of fabricating a mask, the method including performing first optical proximity correction on first segments, obtaining a correspondence relationship between a feature of each of the first segments defined based on optical characteristics of a mask and an aperture and a bias value associated with each of the first segments, performing second optical proximity correction on second segments, and fabricating a mask based on a result of the second optical proximity correction. A feature of each of the second segments is obtained based on optical characteristics of a mask and the aperture. A bias value, that is obtained to correspond to the feature of each of the second segments based on the correspondence relationship, is allocated as an initial bias value to each of the second segments.

20 Claims, 15 Drawing Sheets

(56) References Cited

U.S. PATENT DOCUMENTS

| | | | |
|---|---|---|---|
| 7,360,199 B2* | 4/2008 | Scaman | G03F 1/36 382/144 |
| 7,539,954 B2 | 5/2009 | Adam | |
| 7,778,805 B2* | 8/2010 | Huang | G03F 1/68 703/2 |
| 7,861,207 B2 | 12/2010 | Word et al. | |
| 7,962,868 B2 | 6/2011 | Lucas et al. | |
| 8,201,110 B1* | 6/2012 | Gu | G03F 7/70441 716/53 |
| 8,402,397 B2 | 3/2013 | Robles et al. | |
| 8,434,031 B2 | 4/2013 | Granik | |
| 8,490,030 B1* | 7/2013 | Chiang | G06F 17/50 716/51 |
| 8,612,902 B1* | 12/2013 | Agarwal | G03F 7/70433 716/54 |
| 8,661,373 B2 | 2/2014 | Di Giacomo et al. | |
| 9,626,459 B2* | 4/2017 | Agarwal | G06F 17/50 |
| 9,710,588 B2* | 7/2017 | Ho | G06F 17/5072 |
| 9,747,401 B2* | 8/2017 | Hamouda | G06F 17/5068 |
| 2007/0038417 A1 | 2/2007 | Huang et al. | |
| 2007/0209029 A1 | 9/2007 | Ivonin et al. | |
| 2008/0077907 A1* | 3/2008 | Kulkarni | G03F 1/36 716/53 |
| 2008/0301611 A1* | 12/2008 | Word | G03F 1/36 716/119 |
| 2009/0214984 A1* | 8/2009 | Ling | G03F 7/70425 430/319 |
| 2009/0217224 A1* | 8/2009 | Wiaux | G03F 1/44 716/106 |
| 2009/0249261 A1* | 10/2009 | Kim | G03F 1/36 716/132 |
| 2010/0182580 A1* | 7/2010 | Wang | G03B 27/32 355/67 |
| 2010/0223590 A1* | 9/2010 | Lippincott | G03F 1/36 716/52 |
| 2010/0251202 A1* | 9/2010 | Pierrat | G03F 1/36 716/50 |
| 2012/0051621 A1* | 3/2012 | Ong | G03F 1/84 382/144 |
| 2013/0139116 A1* | 5/2013 | Chow | G03F 1/36 716/51 |
| 2016/0378902 A1* | 12/2016 | Graur | G06F 17/5081 716/52 |
| 2017/0363950 A1* | 12/2017 | Sriraman | G03F 1/36 |

OTHER PUBLICATIONS

Gu, et al., "Optical Proximity Correction with Linear Regression", IEEE Transactions on Semiconductor Manufacturing, vol. 21, No. 2, May 2008, p. 263-271.

Yamazoe, "Computation Theory of Partially Coherent Imaging by Stacked Pupil Shift Matrix", vol. 25, No. 12, Dec. 2008, p. 3111-3119.

* cited by examiner

| k | $q_k$ | Bias Value |
|---|---|---|
| 1 | $[p_{11}, p_{12}, p_{13}]$ | $b_1$ |
| 2 | $[p_{21}, p_{22}, p_{23}]$ | $b_2$ |
| ⋮ | ⋮ | ⋮ |
| m | $[p_{m1}, p_{m2}, p_{m3}]$ | $b_m$ |

METHOD OF PROVIDING INITIAL BIAS VALUE FOR OPTICAL PROXIMITY CORRECTION, AND MASK FABRICATING METHOD WITH OPTICAL PROXIMITY CORRECTION BASED ON THE INITIAL BIAS VALUE

CROSS-REFERENCE TO RELATED APPLICATION

Korean Patent Application No. 10-2015-0109527, filed on Aug. 3, 2015, in the Korean Intellectual Property Office, and entitled: "Method of Providing Initial Bias Value for Optical Proximity Correction, and Mask Fabricating Method with Optical Proximity Correction Based on the Initial Bias Value," is incorporated by reference herein in its entirety.

BACKGROUND

1. Field

The present disclosure relates to a semiconductor process.

2. Description of the Related Art

Various kinds of electronic devices may be used. An electronic device may perform its own function according to operations of various kinds of chips or circuits that may be included therein. The chips or circuits of the electronic device may be implemented with semiconductor elements that may be fabricated by a semiconductor process.

SUMMARY

Embodiments may be realized by providing a method of fabricating a mask, the method including performing first optical proximity correction on first segments, the first segments being obtained by dividing an outline of a first design layout; obtaining a correspondence relationship between a feature of each of the first segments and a bias value associated with each of the first segments, the feature of each of the first segments being defined based on an optical characteristic of a mask corresponding to the first design layout and optical characteristics of an aperture that are respectively generated by a plurality of light sources, the bias value associated with each of the first segments being calculated by the first optical proximity correction; performing second optical proximity correction on second segments, the second segments being obtained by dividing an outline of a second design layout; updating the second design layout based on a result of the second optical proximity correction; and fabricating a mask corresponding to the updated second design layout, performing the second optical proximity correction including obtaining a feature of each of the second segments, based on an optical characteristic of a mask corresponding to the second design layout and optical characteristics of the aperture that are respectively generated by the plurality of light sources; and allocating a bias value, that is obtained to correspond to the feature of each of the second segments based on the correspondence relationship, to each of the second segments as an initial bias value.

The first design layout may be a sample design layout designed to obtain the correspondence relationship, and the second design layout may be a normal design layout designed to fabricate the mask corresponding to the updated second design layout.

The feature of each of the first segments may be defined based on a basis intensity that is calculated with respect to an evaluation point of a respective first segment.

The basis intensity may be calculated by squaring a convolution of an object function and a point spread function with respect to the evaluation point of the respective first segment, the object function indicating the optical characteristic of the mask corresponding to the first design layout in a space domain, the point spread function being obtained by performing a Fourier transform on a pupil function, the pupil function indicating each of the optical characteristics of the aperture that are respectively generated by the plurality of light sources in the space domain.

Embodiments may be realized by providing a method of fabricating a mask, the method including allocating initial bias values that correspond to some or all of a plurality of segments to the some or all of the plurality of segments, the plurality of segments being obtained by dividing an outline of a design layout; performing optical proximity correction on the plurality of segments where the initial bias values are allocated; updating the design layout based on a result of the optical proximity correction; and fabricating a mask corresponding to the updated design layout, the initial bias values being respectively determined according to features of the plurality of segments, the features of the plurality of segments being defined based on an optical characteristic of a mask corresponding to the design layout and optical characteristics of an aperture that are respectively generated by a plurality of light sources.

A feature of each of the plurality of segments may be defined based on a basis intensity that is calculated with respect to an evaluation point of a respective segment.

The basis intensity may be calculated by squaring a convolution of an object function and a point spread function with respect to the evaluation point of the respective segment, the object function indicating the optical characteristic of the mask corresponding to the design layout in a space domain, the point spread function being obtained by performing a Fourier transform on a pupil function, the pupil function indicating each of the optical characteristics of the aperture that are generated by the plurality of light sources in the space domain.

Each of the initial bias values may be provided based on a correspondence relationship between a feature of each of a plurality of sample segments and a bias value associated with each of the plurality of sample segments, the plurality of sample segments being obtained by dividing an outline of a sample design layout, the bias value associated with each of the plurality of sample segments being calculated by sample optical proximity correction that is performed on the plurality of sample segments.

The feature of each of the plurality of sample segments may be defined based on an optical characteristic of a mask corresponding to the sample design layout and the optical characteristics of the aperture that are respectively generated by the plurality of light sources.

Allocating the initial bias values may include biasing the some or all of the plurality of segments by the initial bias values, respectively, and performing the optical proximity correction may include performing the optical proximity correction on the plurality of segments that includes the biased segments.

Embodiments may be realized by providing a method of providing an initial bias value for optical proximity correction, the method including performing sample optical proximity correction on a plurality of segments, the plurality of segments being obtained by dividing an outline of a sample design layout; defining a feature of each of the plurality of segments, based on an optical characteristic of a mask corresponding to the sample design layout and optical characteristics of an aperture that are respectively generated by a plurality of light sources; and obtaining a correspondence relationship between the feature of each of the plurality of segments and a bias value associated with each of the plurality of segments, the bias value being calculated by the sample optical proximity correction, the initial bias value being provided based on the correspondence relationship.

The method may further include calculating reference values that are used to calculate bias values associated with the plurality of segments from features of the plurality of segments, based on the correspondence relationship.

The reference values may be calculated by performing linear regression analysis or neural network analysis on a relationship between the features of the plurality of segments and the bias values associated with the plurality of segments.

The initial bias value may be provided based on a feature of a target segment and the reference values, the target segment being obtained by dividing an outline of a normal design layout that is provided for the optical proximity correction.

The feature of the target segment may be defined based on an optical characteristic of a mask corresponding to the normal design layout and the optical characteristics of the aperture that are respectively generated by the plurality of light sources.

Defining the feature of each of the plurality of segments may include defining the feature of each of the plurality of segments based on a selected number of optical characteristics from among the optical characteristics of the aperture that are generated by the plurality of light sources, and a contribution of the selected number of optical characteristics to defining the feature of each of the plurality of segments may be greater than a contribution of optical characteristics other than the selected number of optical characteristics.

The selected number may be changed considering at least one of accuracy and speed associated with the optical proximity correction.

The feature of each of the plurality of segments may be defined further based on an additional criterion that is used to identify each of the plurality of segments.

The additional criterion may include a length of each of the plurality of segments.

The method may further include updating the correspondence relationship based on a final bias value that is obtained as a result of the optical proximity correction.

Embodiments may be realized by providing a method of fabricating a mask used in a semiconductor process, the method including projecting light through the mask, through an aperture, and onto a wafer; estimating distortion of a layout to be printed on the wafer based on optical characteristics of the mask and the aperture to provide an estimated result; biasing image patterns to be formed on the mask based on the estimated result; and printing a circuit pattern corresponding to image patterns of the mask on the wafer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
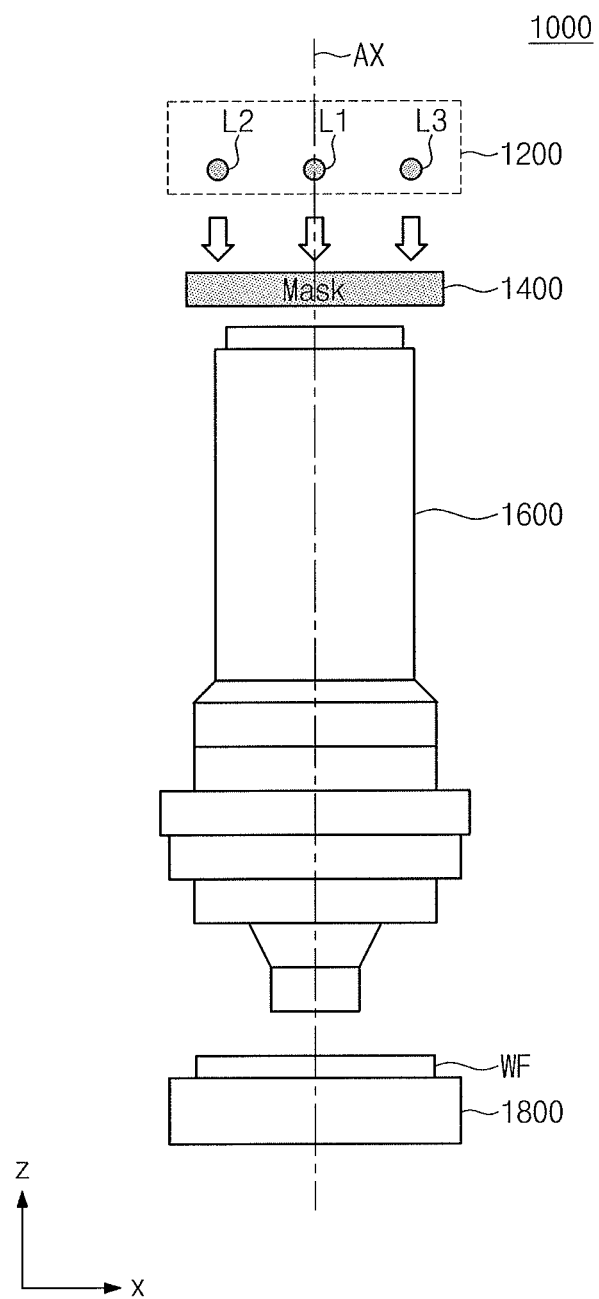
FIG. 1 illustrates a conceptual diagram of a photolithography system using a mask fabricated according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

If it is mentioned that any configuration includes/comprises specific component(s) or any process includes/comprises specific operation(s) in the present disclosure, this means that other component(s) or other operation(s) may be further included. That is, the terms used herein are only intended to describe the specific example embodiments, and is not intended to limit the scope of the present disclosure. Further, the examples described to aid understanding of the present disclosure include their complementary embodiments.

The terms used herein have the meanings in which those skilled in the art would generally understand. The terms commonly used are to be construed as the consistent meanings in the context of the present disclosure. In addition, the terms used herein should not be interpreted as an overly ideal or formal sense unless explicitly so defined herein. Hereinafter, example embodiments of the present disclosure will be described below with reference to the attached drawings.

The configuration shown in each of schematic diagrams is only to be understood just from the conceptual point of view. To aid understanding of the present disclosure, forms, structures, sizes of each component shown in each conceptual diagram may be exaggerated or reduced. A configuration actually implemented may have a different physical shape from that shown in each conceptual diagram. Each conceptual diagram is not intended to limit the physical shape of the components.

A device configuration shown in each block diagram is provided to aid understanding of the present disclosure. Each block may be formed of smaller blocks according to functions. In an embodiment, a plurality of blocks may form a larger block according to a function. That is, the spirit or the scope of the present disclosure is not limited to the configuration shown in a block diagram.

FIG. 1 illustrates a conceptual diagram of a photolithography system using a mask fabricated according to an example embodiment. Referring to FIG. 1, a photolithography system 1000 may include a plurality of light sources 1200, a mask 1400, a reduction project device 1600, and a wafer stage 1800. In some example embodiments, the photolithography system 1000 may further include components that are not illustrated in FIG. 1. For example, the photolithography system 1000 may further include a sensor that may be used to measure a height and a slope of a surface of the wafer WF.

In some example embodiments, the light sources 1200 may include three light sources L1, L2, and L3. Each of the light sources L1, L2, and L3 may emit light. For example, each of the light sources L1, L2, and L3 may be a point light source. The light emitted from each of the light sources L1, L2, and L3 may be provided to the mask 1400. In some example embodiments, a lens may be provided between the light sources 1200 and the mask 1400 to adjust an optical focusing. In some example embodiments, each of the light sources L1, L2, and L3 may include an ultraviolet light source (e.g., a Krypton and Fluoride (KrF) light source having a wavelength of 234 nm or an Argon and Fluoride (ArF) light source having a wavelength of 193 nm).

In some example embodiments, the light sources 1200 may include the light source L1 that is placed on an optical axis AX of the system 1000, and light sources L2 and L3 that are offset relative to the optical axis AX along a first direction (x-direction). FIG. 1 illustrates an example configuration, and disposition of light sources included in the light sources 1200 may be variously changed or modified. It is illustrated that the light sources 1200 include three light sources L1, L2, and L3, but the number of light sources may be variously changed or modified. To aid understanding, three light sources L1, L2, and L3 are provided in the following descriptions.

The mask 1400 may include image patterns that are used to print a layout on the wafer WF. The image patterns may define a transparent region and an opaque region. The transparent region may be formed by etching a metal layer on the mask 1400. The light emitted from the light sources 1200 may pass through the transparent region. The light may not pass through the opaque region and the opaque region may block the light.

The mask 1400 may be fabricated according to a mask fabricating method according to an example embodiment of the present disclosure. Example embodiments will be described with reference to FIGS. 2 to 18 below.

The reduction project device 1600 may receive the light that passes through the transparent region of the mask 1400. The reduction project device 1600 may match circuit patterns of a layout to be printed on the wafer WF with the image patterns of the mask 1400. The wafer stage 1800 may support the wafer WF.

In some example embodiments, the reduction project device 1600 may include an aperture. The aperture may be used to increase a focus depth of an ultraviolet light emitted from the light sources 1200. For example, the aperture may include a dipole aperture or a quadruple aperture. The reduction project device 1600 may include a lens to adjust an optical focusing.

The light emitted from the light sources 1200 may pass the transparent region included in the image patterns of the mask 1400. The light passing the mask 1400 may be projected onto the wafer WF through the reduction project device 1600, and a layout including circuit patterns corresponding to the image patterns of the mask 1400 may be printed on the wafer WF.

As integration of the semiconductor process increases, a distance between the image patterns of the mask 1400 may become closer and closer, and a width of the transparent region may become even narrower. Because of such "proximity", interference and diffraction of the light may occur, and a distorted layout that is different from a desired layout may be printed on the wafer WF. When the distorted layout is printed on the wafer WF, a designed circuit may operate abnormally.

A resolution enhancement technology may be employed to prevent distortion of a layout. "Optical proximity correction" is an example of the resolution enhancement technology. Based on the optical proximity correction, a degree of distortion, e.g., interference and diffraction of the light, may be estimated in advance. Based on an estimated result, the image patterns to be formed on the mask 1400 may be biased in advance, and the desired layout may be printed on the wafer WF.

To obtain bias values that may make it possible to print a desired layout, iterations may be performed many times in the optical proximity correction. During performance of the iterations, the image patterns may be gradually biased and may become closer to providing a final result. The iterations may take a lot of time in the optical proximity correction.

According to an example embodiment, the image patterns may be biased to be close to providing the final result in advance. An initial bias value may be provided based on optical environments formed by the light sources 1200. According to an example embodiment, the number of the iterations that take a lot of time in the optical proximity correction may be reduced, and speed and efficiency of the optical proximity correction may be improved. Below, the example embodiments will be described in further detail with reference to FIGS. 2 to 19.

Figure 2:
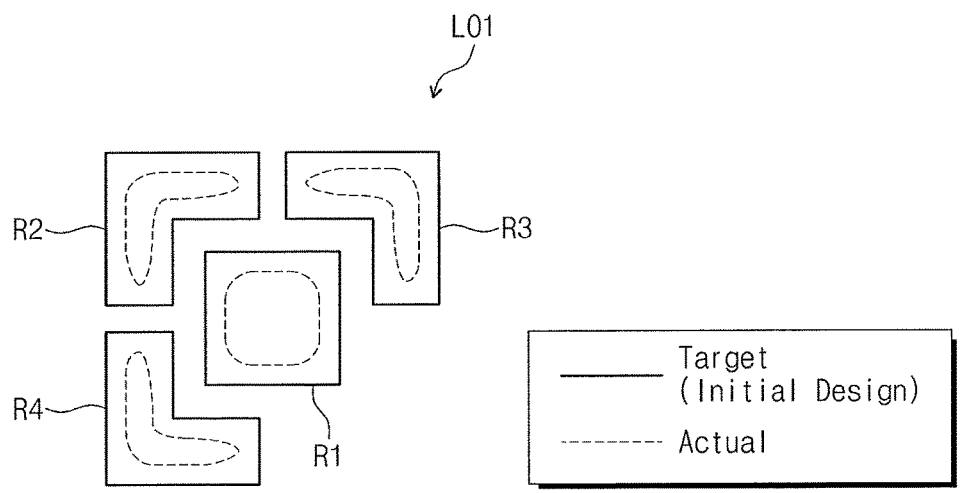
FIG. 2 illustrates a conceptual diagram of a layout on a wafer.

FIG. 2 illustrates a conceptual diagram of a layout on a wafer. A solid line in FIG. 2 may denote a "target layout" that is desired to be printed on the wafer WF illustrated in FIG. 1. A dotted line in FIG. 2 may denote an "actual layout" that may be actually printed on the wafer WF in FIG. 1.

For example, a layout LO1 may include first to fourth circuit patterns R1 to R4. An exemplary shape of the layout LO1 illustrated in FIG. 2.

For example, a designer of the layout LO1 may intend to print the layout LO1 of the first to fourth circuit patterns R1 to R4 along the solid line in FIG. 2 on the wafer WF. The solid line in FIG. 2 may denote a layout to be printed on the wafer WF as the target layout. The target layout may be provided as an "initial design layout". The "design layout" may be associated with the image patterns to be included in the mask 1400 of FIG. 1 to print the target layout on the wafer WF.

Distortion, such as interference and diffraction of the light, may occur by the mask 1400. Due to, for example, this distortion, when the mask 1400 simply includes image patterns corresponding to the solid lines in FIG. 2, the first to fourth circuit patterns R1 to R4 along the dotted line in FIG. 2 may be actually printed on the wafer WF, unlike the desired design. When the distorted layout along the dotted line in FIG. 2 is printed on the wafer WF, the designed circuit may abnormally operate unlike the desired design.

To prevent the distortion of a layout, the optical proximity correction may be performed. To reduce an error between an actual layout (i.e., a layout to be actually printed based on a design layout) and a target layout, the design layout may be biased in the optical proximity correction. When the image patterns corresponding to the design layout that is biased by estimating distortion due to, for example, interference and diffraction of the light, are included in the mask 1400, the actual layout that is substantially identical (i.e., that has a negligible error) to the target layout may be printed on the wafer WF. The process of the optical proximity correction will be described with reference to FIGS. 3 and 4.

Figure 3:
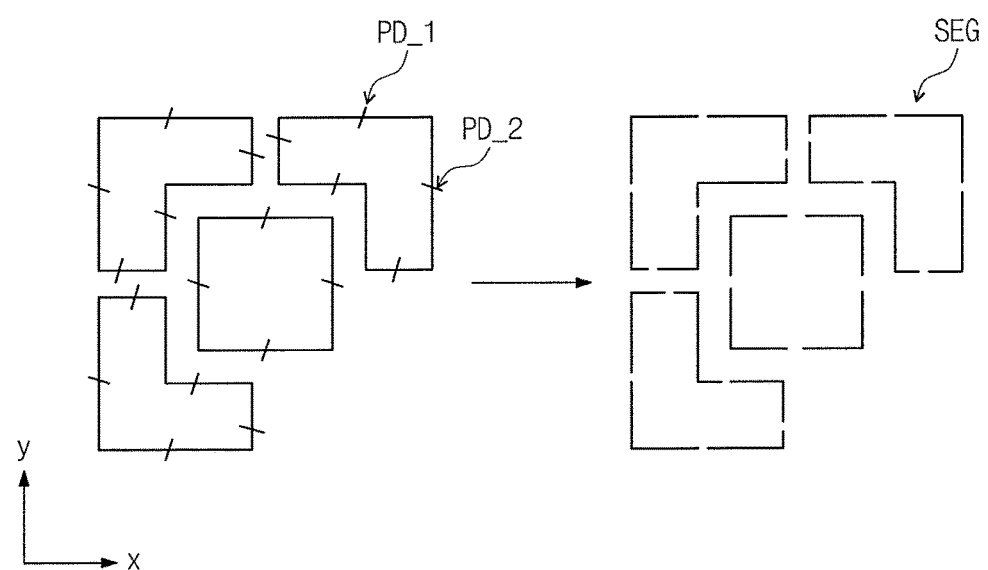
FIG. 3 illustrates a conceptual diagram of a process of dividing an outline of a design layout into a plurality of segments in optical proximity correction.

FIG. 3 illustrates a conceptual diagram of a process of dividing an outline of a design layout into a plurality of segments in optical proximity correction. To aid understanding, the process of dividing a design layout along a solid line illustrated in FIG. 2 into a plurality of segments will be described.

A plurality of division points may be set on an outline of the design layout. For example, a first division point PD_1 and a second division point PD_2 may be set on the outline of the design layout. Based on the first division point PD_1 and the second division point PD2, one segment SEG may be obtained. In a similar manner, the outline of the design layout may be divided into a plurality of segments based on the division points.

Herein, the term "division" is used, but this may not mean a physical division. In FIG. 3, it is illustrated that the plurality of segments is physically divided, but this is conceptually provided to aid understanding.

In the optical proximity correction, each of the divided segments may become a target of biasing. Each of the divided segments may be independently biased. For example, the segment SEG may be biased along one of a first direction (e.g., a positive direction or an outward direction) and a second direction (e.g., a negative direction or an inward direction). Each of the divided segments may be biased to reduce an error between an actual layout and a target layout.

For example, to perform the optical proximity correction, a Jacobian matrix "J" such as the following Equation 1 may be defined. For example, when an outline of a design layout is divided into K segments, the Jacobian matrix "J" may have a size of (K×K) (where K is an integer greater than one).

$$J = \begin{pmatrix} \frac{\partial f_1}{\partial x_1} & \frac{\partial f_1}{\partial x_2} & \cdots & \frac{\partial f_1}{\partial x_K} \\ \frac{\partial f_2}{\partial x_1} & \frac{\partial f_2}{\partial x_2} & \cdots & \frac{\partial f_2}{\partial x_K} \\ \vdots & \vdots & \ddots & \vdots \\ \frac{\partial f_K}{\partial x_1} & \frac{\partial f_K}{\partial x_2} & \cdots & \frac{\partial f_K}{\partial x_K} \end{pmatrix}$$ [Equation 1]

A denominator of each of components in the Jacobian matrix "J" may be an amount of biasing for the t-th segment, and a numerator of each component may denote an influence on the s-th segment by the t-th segment (where each of 't' and 's' is an integer between 1 and K). For example, an operation using an inverse matrix of the Jacobian matrix "J" in Equation 1 (e.g., an operation using a Newton method) may be performed to calculate bias values respectively corresponding to the K segments. Until the error between the actual layout and the target layout is within an allowable level, the process of calculating bias values respectively corresponding to the K segments may be repeated.

The process of calculating bias values may be readily discernable by those skilled in the art, and detailed descriptions associated with the process of calculating bias values will be omitted below. Each of the K segments may be biased based on the calculated bias values. An example of an updated design layout that is obtained based on the biased segments will be described with reference to FIG. 4.

Figure 4:
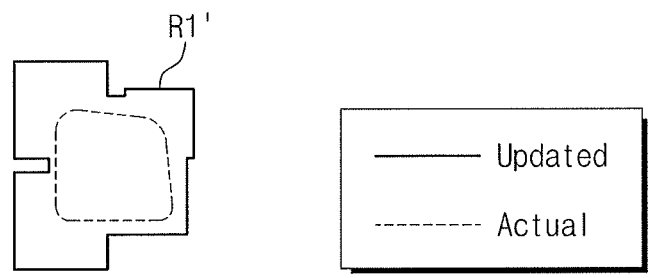
FIG. 4 illustrates a conceptual diagram of a design layout updated by optical proximity correction.

FIG. 4 illustrates a conceptual diagram of a design layout updated by optical proximity correction. To aid understanding, for example, a new first circuit pattern R1' updated from the first circuit pattern R1 of FIG. 2 will be described. For brevity of the description, descriptions corresponding to the second to fourth circuit patterns R2 to R4 will be omitted below.

A solid line illustrated in FIG. 4 may denote the new first circuit pattern R1' included in an updated design layout. According to the process described with reference to FIG. 3, an outline of the first circuit pattern R1 illustrated in FIG. 2 may be divided into several segments, and each of the divided segments may be biased. As illustrated in FIG. 4, each of the segments may be biased along one of a first direction (e.g., a positive direction or an outward direction) and a second direction (e.g., a negative direction or an inward direction). In some cases, some segments may not be biased, and the new first circuit pattern R1' may be obtained.

Each of the divided segments may be biased to reduce an error between an actual layout and a target layout. For example, a dotted line in FIG. 4 may denote an actual layout to be actually printed on the wafer WF of FIG. 1 based on the updated design layout. The error between the actual layout and the target layout may be reduced by biasing each of the divided segments.

The process of biasing segments that is obtained by dividing an outline of a design layout may be repeated, until the error between the actual layout and the target layout is within an allowable level (i.e., until a final design layout that may make it possible to print the actual layout being substantially identical to the target layout is obtained). Iterations may be repeated many times, and a time taken for optical proximity correction may increase due to, for example, the iterations.

Figure 17:
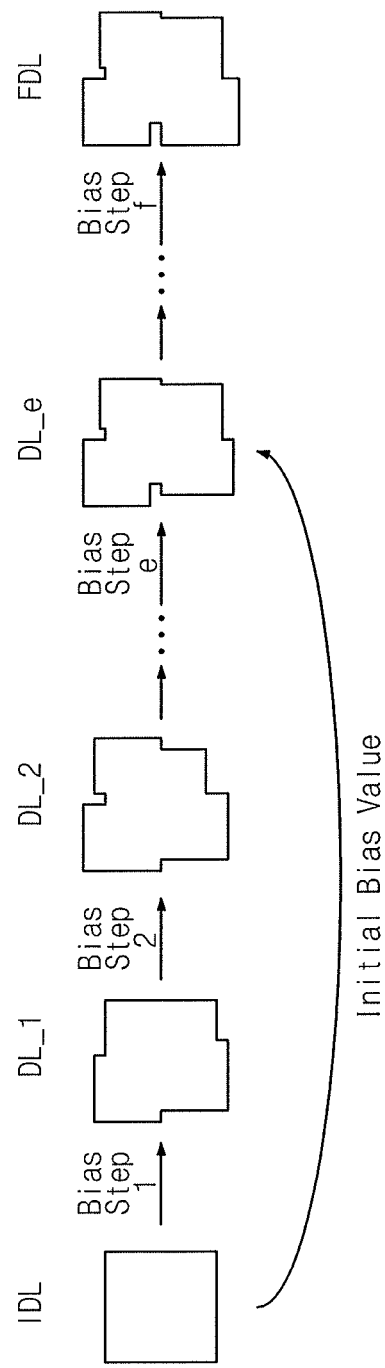
FIG. 17 illustrates a conceptual diagram for describing an effect obtained according to an example embodiment.

If the design layout is previously biased by an amount that may make it possible to print the actual layout being close to the target layout, the number of the iterations may be reduced (refer to FIG. 17). In some example embodiments, an initial bias value for biasing a design layout in advance may be obtained. According to an example embodiment, the initial bias value may be obtained based on an optical environment, and the initial bias value that may make it possible to print the actual layout being close to the target layout may be obtained.

Below, the process of obtaining the initial bias value based on an optical environment according to some example embodiments will be described. Before that, an optical environment for a photolithography system that may make it possible to implement an example embodiment will be described with reference to FIGS. 5 to 10.

Figure 5:
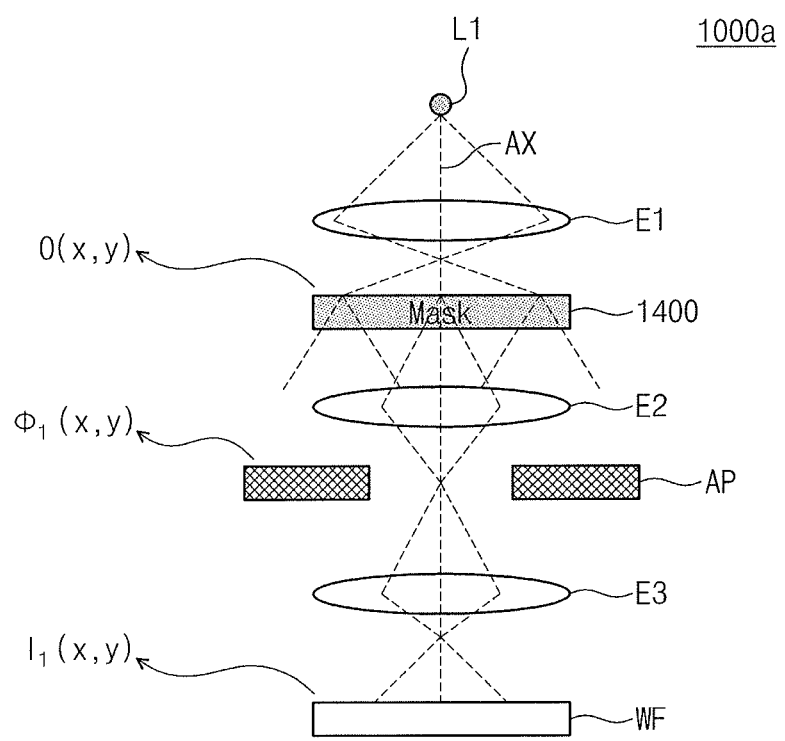
FIG. 5 illustrates a conceptual diagram for describing an optical environment formed by a light source placed on an optical axis.

FIG. 5 illustrates a conceptual diagram for describing an optical environment formed by a light source placed on an optical axis. For example, FIG. 5 illustrates an optical environment 1000a formed by a light source L1 that is placed along an optical axis AX in the photolithography system 1000 of FIG. 1.

Light emitted from the light source L1 may be provided to the mask 1400. In some example embodiments, a lens E1 may be provided between the light source L1 and the mask 1400 to adjust an optical focusing. The light provided from the light source L1 may pass a transparent region of image patterns included in the mask 1400. A portion of the light passing the mask 1400 may be diffracted or may interfere with each other.

In some example embodiments, the reduction project device 1600 of FIG. 1 may include lenses E2 and E3 to further adjust optical focusing, and may include an aperture AP to increase a focus depth. The light passing the transparent region of the mask 1400 may be projected onto the wafer WF through the lens E2, the aperture AP, and the lens E3.

As described above, the image patterns included in the mask 1400 may define a transparent region and an opaque region. The mask 1400 may have a specific "optical characteristic" for passing or blocking the light, depending on the image patterns. The optical characteristic of the mask 1400 may be mathematically modeled. A mathematical model denoting the optical characteristic of the mask 1400 in a space domain may be referred to as an "object function", and the object function may be expressed by "O(x,y)". The optical characteristic of the mask 1400 will be further described with reference to FIG. 6.

The aperture AP may include a passing region where the light may pass and a blocking region for blocking the light, and the aperture AP may also have a specific optical characteristic for passing or blocking the light. A mathematical model denoting the optical characteristic of the aperture AP in a space domain may be referred to as a "pupil function", and the pupil function may be expressed by "$\varphi_i(x,y)$". Herein, "i" may be an index indicating a light source. For example, an optical characteristic of the aperture AP that may be generated by the first light source L1 may be expressed by "$\varphi_1(x,y)$". The optical characteristic of the aperture AP will be further described with reference to FIGS. 7 and 9.

Based on the optical characteristic of the mask 1400 and the optical characteristic of the aperture AP that may be generated by the first light source L1, a specific circuit pattern may be printed on the wafer WF. This circuit pattern may be also mathematically modeled, and may be expressed by "$I_1(x,y)$". Herein, an index "1" may mean that the first light source L1 affects the circuit pattern. The circuit pattern will be further described with reference to FIG. 10.

Figure 6:
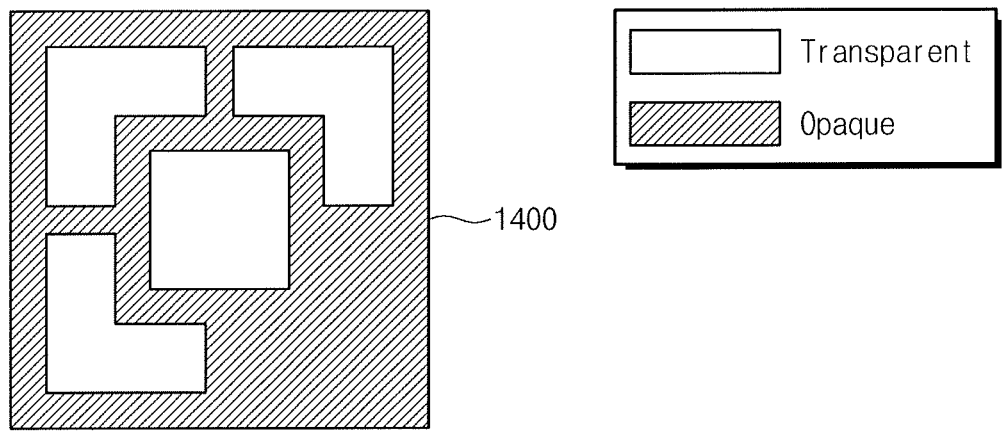
FIG. 6 illustrates a conceptual diagram for describing an optical characteristic of a mask.

FIG. 6 illustrates a conceptual diagram for describing an optical characteristic of a mask. The mask 1400 may include a transparent region and an opaque region, as described above. In FIG. 6, for example, the transparent region is illustrated by white polygons, and the opaque region is illustrated by a polygon including hatching lines.

Light may pass the transparent region. Light may not pass the opaque region, i.e., the opaque region may block the light. For example, a coordinate may be set to indicate a specific position on the mask 1400. A coordinate for a horizontal direction may be expressed by a variable "x", and a coordinate for a vertical direction may be expressed by a variable "y". For example, any coordinate on the transparent region may correspond to a value of "1" (i.e., (x,y)→1), and any coordinate on the opaque region may correspond to a value of "0" (i.e., (x,y)→0)

Based on the coordinates on the transparent region and the opaque region, an optical characteristic of the whole mask 1400 may be mathematically modeled. A mathematical model denoting the optical characteristic of the mask 1400 in a space domain may be expressed by an object function "O(x,y)". For example, the object function may have a value of "1" (i.e., O(x,y)=1) for the transparent region. The object function may have a value of "0" (i.e., O(x,y)=0) for the opaque region. The object function may denote whether the light may pass or may be blocked in any coordinate.

Figure 7:
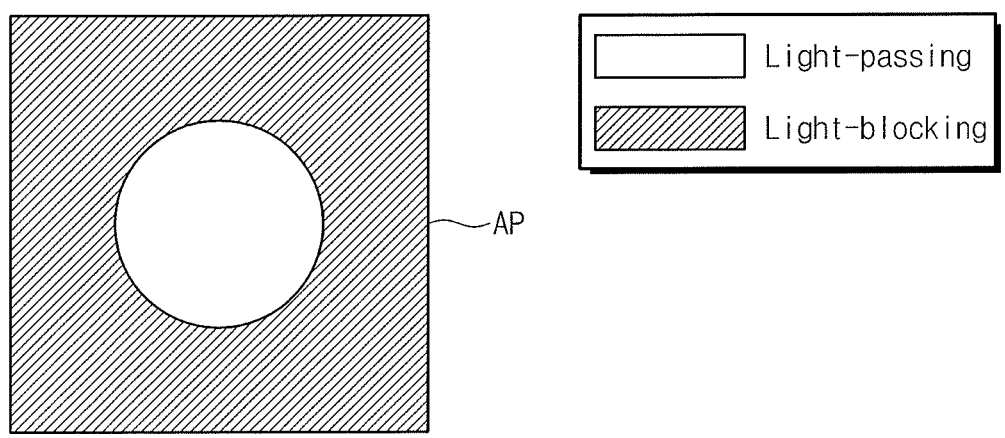
FIG. 7 illustrates a conceptual diagram for describing an optical characteristic of an aperture.

FIG. 7 illustrates a conceptual diagram for describing an optical characteristic of the aperture AP. The aperture AP may include a passing region and a blocking region, as described above. In FIG. 7, for example, the passing region is illustrated by a white circle, and the blocking region is illustrated by a polygon including hatching lines.

Light may pass the passing region. The blocking region may block the light. For example, a coordinate may be set to indicate a specific position on the aperture AP. A coordinate for a horizontal direction may be expressed by a variable "x", and a coordinate for a vertical direction may be expressed by a variable "y". For example, any coordinate on the passing region may correspond to a value of "1" (i.e., (x,y)→1), and any coordinate on the blocking region may correspond to a value of "0" (i.e., (x,y)→0).

Based on the coordinates of the passing region and the blocking region, the optical characteristic of the whole aperture AP may be mathematically modeled. A mathematical model denoting the optical characteristic of the aperture AP in a space domain may be expressed by the pupil function "$\varphi_i(x,y)$". For example, the pupil function may have a value of "1" (i.e., $\varphi_i(x,y)=1$) for the passing region. The pupil function may have a value of "0" (i.e., $\varphi_i(x,y)=0$) for the blocking region. The pupil function may denote whether the light may pass or may be blocked in any coordinate.

As it will be described with reference to FIGS. 8 and 9, the aperture AP may have different optical characteristics depending on positions of light sources, and the pupil function associated with the optical characteristic of the aperture AP may be changed according to a position of a light source relative to the optical axis AX.

Figure 8:
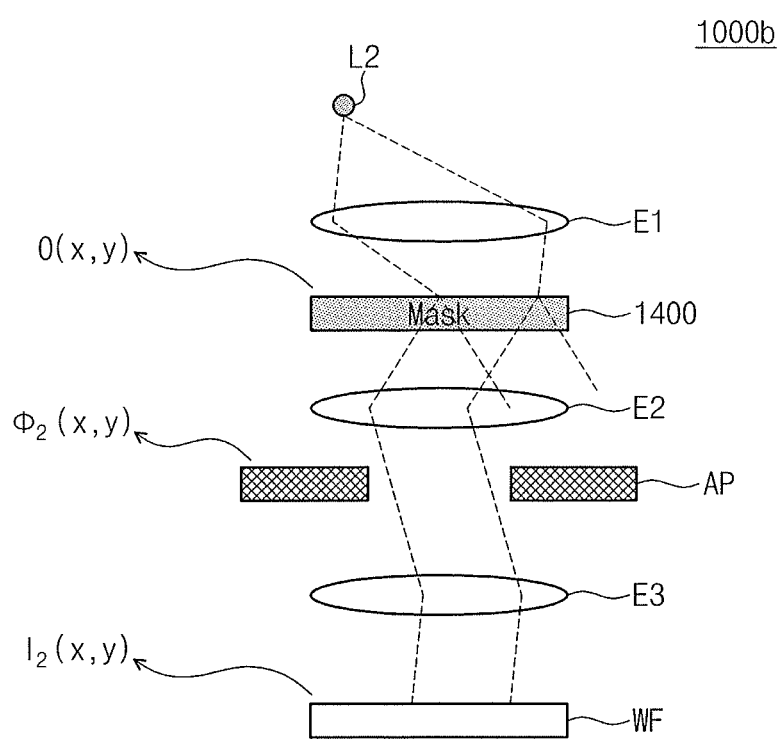
FIG. 8 illustrates a conceptual diagram for describing an optical environment formed by an off-axis light source.

FIG. 8 illustrates a conceptual diagram for describing an optical environment formed by an off-axis light source. For example, FIG. 8 illustrates an optical environment 1000b formed by the off-axis light source L2 in the photolithography system 1000 of FIG. 1.

Light emitted from the light source L2 may be provided to the mask 1400. In some example embodiments, a lens E1 may be provided between the light source L2 and the mask 1400 to adjust an optical focusing. The light provided from the light source L2 may pass through the transparent region of image patterns included in the mask 1400. As described with reference to FIGS. 5 and 6, the mask 1400 may have a specific optical characteristic. The optical characteristic of the mask 1400 may be expressed by the object function "O(x,y)".

In some example embodiments, the reduction project device 1600 of FIG. 1 may include the lenses E2 and E3 to adjust an optical focusing, and may include the aperture AP to increase a focus depth. The light passing the transparent region of the mask 1400 may be projected onto the wafer WF through the lens E2, the aperture AP, and the lens E3. As described with reference to FIGS. 5 and 7, the aperture AP may also have a specific optical characteristic.

As it will be described with reference to FIG. 9, the aperture AP may have different optical characteristics depending on positions of light sources relative to the optical axis AX. Comparing FIG. 8 to FIG. 5, a light path from the light source L2 may be different from a light path from the light source L1 in FIG. 5, and the optical characteristic of the aperture AP may appear different to the light source L2 than the light source L1.

While the optical characteristic of the aperture AP that may be generated by the light source L1 may be expressed by the pupil function "$\varphi_1(x,y)$", the optical characteristic of the aperture AP that may be generated by the light source L2 may be expressed by the pupil function "$\varphi_2(x,y)$". The pupil function associated with an optical characteristic of the aperture AP may be changed depending on a position of a light source relative to the optical axis AX.

Based on the optical characteristic of the mask 1400 and the optical characteristic of the aperture AP that may be generated by the first light source L2, a specific circuit pattern may be printed on the wafer WF. This circuit pattern may be also mathematically modeled and may be expressed by "$I_2(x,y)$". Herein, an index "2" may mean that the second light source L2 affects the circuit pattern. The optical characteristic of the aperture AP may be changed depending on a light source, and the light source may affect a circuit pattern to be printed on the wafer WF.

Figure 9:
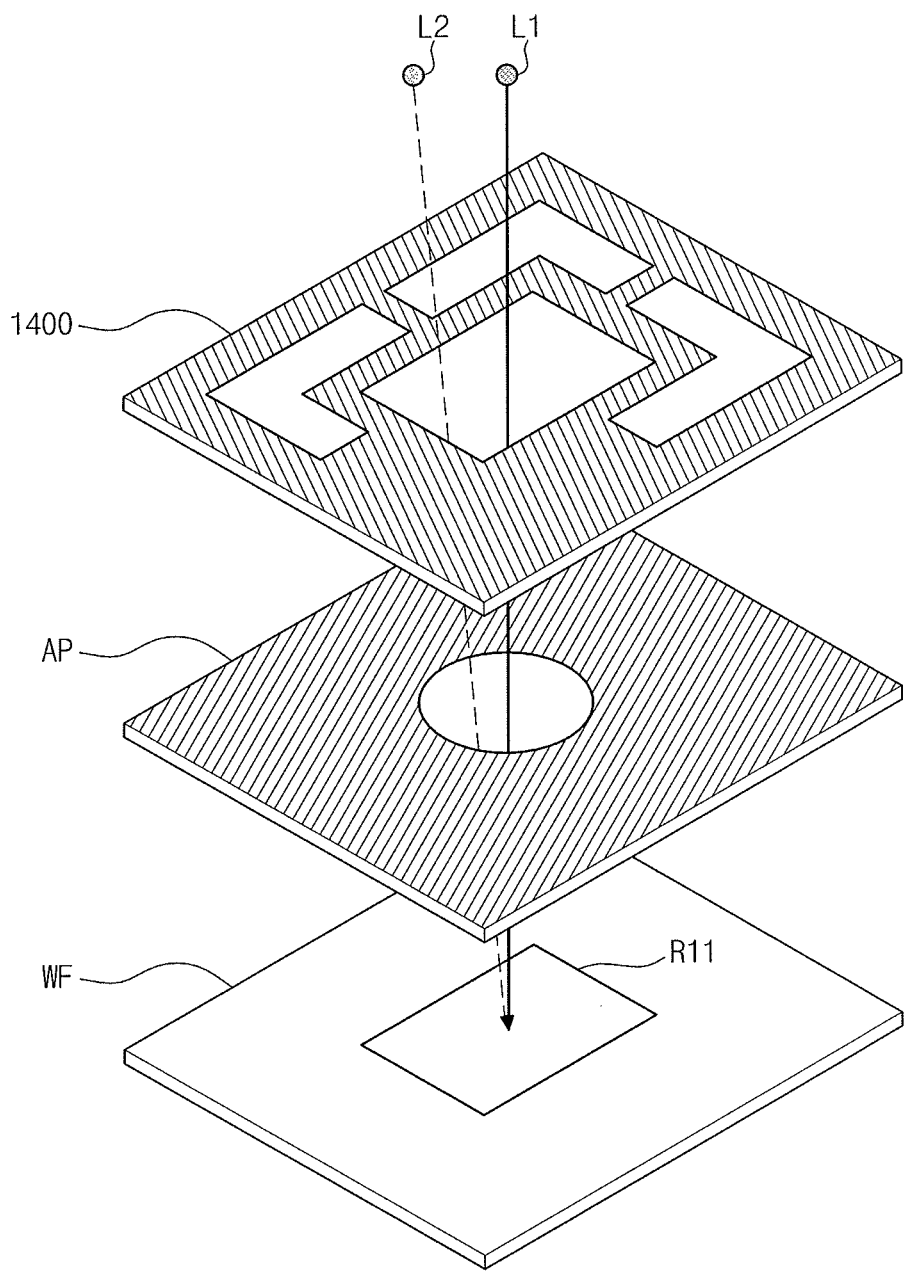
FIG. 9 illustrates a conceptual diagram for describing an optical characteristic of an aperture that varies according to a position of a light source.

FIG. 9 illustrates a conceptual diagram for describing an optical characteristic of an aperture that varies according to a position of a light source. To aid understanding, FIG. 9 illustrates an optical environment formed by two light sources L1 and L2.

Light emitted from the first light source L1 placed on an optical axis may be projected onto the wafer WF through a transparent region of the mask 1400 and a passing region of the aperture AP, and for example, a circuit pattern R11 corresponding to the first light source L1 may be printed on the wafer WF.

Similarly, light emitted from the off-axis second light source L2 may be projected onto the wafer WF through a transparent region of the mask 1400 and a passing region of the aperture AP, and the circuit pattern R11 may be printed on the wafer WF based on an optical environment that is formed by the first light source L1 and the second light source L2.

A position of the first light source L1 is different from a position of the second light source L2 relative to the optical axis AX, and the aperture AP may show different optical characteristics depending on the positions of two light sources L1 and L2. For example, when the light emitted from the first light source L1 is provided to the aperture AP through the mask 1400, an object spectrum obtained by performing a Fourier transform on the object function may be applied to the aperture AP. When the light emitted from the second light source L2 is provided to the aperture AP through the mask 1400, the second light source L2 may be shifted from the optical axis AX, compared with the first light source L1, and an object spectrum generated by the first light source L1 may be shifted toward the side edge of the aperture AP.

When the optical environment based on the second light source L2 is observed in view of the first light source L1, it may be regarded that a passing region of the aperture AP may be shifted toward the side edge of the aperture AP. For example, even though the same mask 1400 and the same aperture AP are used, the optical characteristic of the aperture AP may seem to be changed when a position of a light source is changed, and the pupil function associated with the optical characteristic of the aperture AP may vary depending on a position of light source relative to the optical axis AX.

The two light sources L1 and L2 have been described with reference to FIGS. 5 to 9, but the third light source L3 of FIG. 1 and other light sources other than the three light sources L1, L2, and L3 may be similarly described. For brevity of the description, redundant descriptions will be omitted below.

Figure 10:
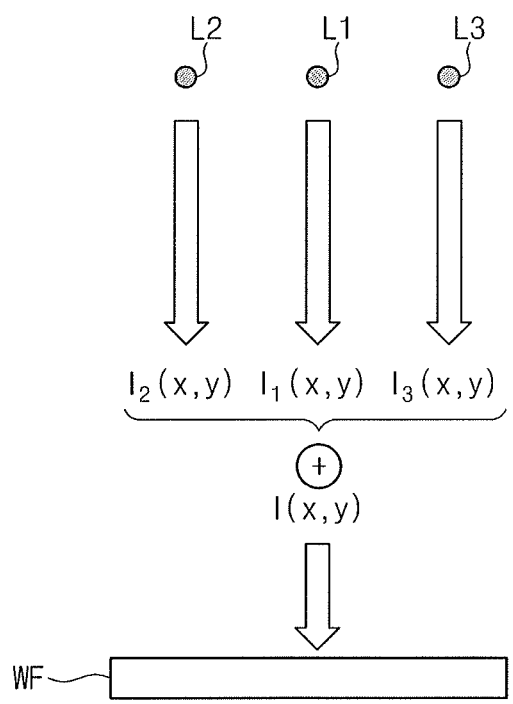
FIG. 10 illustrates a conceptual diagram for describing linearity of a plurality of light sources.

FIG. 10 illustrates a conceptual diagram for describing linearity of a plurality of light sources. To aid understanding, FIG. 10 illustrates an optical environment 1000z including three light sources L1, L2, and L3.

For example, circuit patterns to be printed on the wafer WF by three light sources L1, L2, and L3 may be expressed by mathematical models "$I_1(x,y)$", "$I_2(x,y)$", and "$I_3(x,y)$", respectively. When three light sources L1, L2, and L3 are included together in the optical environment 1000z, all three light sources L1, L2, and L3 may affect the circuit patterns to be printed on the wafer WF. The circuit pattern to be finally printed on the wafer WF based on all three light sources L1, L2, and L3 may be expressed by a mathematical model "$I(x,y)$".

The photolithography system 1000 of FIG. 1 including three light sources L1, L2, and L3 may be designed such that lights respectively emitted from three light sources L1, L2, and L3 do not interfere with one another. For example, three light sources L1, L2, and L3 may have "linearity". Such a system may be referred to as a "partial coherence system". Three light sources L1, L2, and L3 may have linearity in the partial coherence system, and the mathematical model "I(x, y)" may be obtained according to the following Equation 2.

$$I(x,y)=I_1(x,y)+I_2(x,y)+I_3(x,y) \qquad \text{[Equation 2]}$$

When n light sources are employed instead of three light sources L1, L2, and L3, the mathematical model "$I(x,y)$" may be generalized according to the following Equation 3.

$$I(x, y) = \sum_{i=1}^{n} I_i(x, y) \qquad \text{[Equation 3]}$$

In the above Equation 3, "$I_i(x,y)$" may be a mathematical model for a circuit pattern to be printed on the wafer WF corresponding to an i-th light source. In other words, an intensity at a position on the wafer WF may be a sum of the intensifies of the individual light sources on the wafer WF.

Referring to FIG. 9 together, a circuit pattern (e.g., R11) on the wafer WF may be printed based on the light passing through the mask 1400 and the aperture AP, and the circuit pattern to be printed on the wafer WF may be related to an optical characteristic of the mask 1400 and an optical characteristic of the aperture AP that may be generated by the i-th light source. The mathematical model "$I_i(x,y)$" of the circuit pattern may be obtained according to the following Equation 4.

$$I_i(x,y)=\lambda_i|O(x,y)*\Phi_i(x,y)|^2 \qquad \text{[Equation 4]}$$

In the above Equation 4, "$\Phi_i(x,y)$" may denote a "point spread function" that is obtained by performing a Fourier transform on the pupil function "$\varphi_i(x,y)$" corresponding to the i-th light source. The term "$O(x,y)*\Phi_i(x,y)$" may denote a convolution operation of the object function and the point spread function corresponding to the i-th light source. The convolution of two functions may mean an optical field generated based on the i-th light source. A square of the optical field may mean a basis intensity generated by the i-th light source. The circuit pattern to be printed on the wafer WF corresponding to the i-th light source may be mathematically modeled by multiplying the basis intensity by a proper coefficient "$\lambda_i$".

The coefficient "$\lambda_i$" may be obtained by at least one of various methods for the above Equation 4. In some example embodiments, the coefficient "$\lambda_i$" may be simply selected to be proportional to intensity of a light source. In an embodiment, the coefficient "$\lambda_i$" may be selected to have a weight value by transforming a calculation space. Singular value decomposition (SVD) technique is an example about a methodology of transforming a calculation space. A method of obtaining the above Equations 2 to 4 and a method of obtaining the coefficient "$\lambda_i$" may be readily discerned by those skilled in the art, and detailed descriptions about the methods will be omitted below.

As described above, the photolithography system 1000 of FIG. 1 may be implemented with a partial coherence system that may include light sources having linearity. Lights respectively emitted from light sources may not interfere with one another, and the optical characteristic of the mask 1400 and the optical characteristic of the aperture AP that may be generated by a specific light source may be used to uniquely identify each of segments obtained by dividing an outline of a design layout.

Accordingly, a feature of a segment may be defined based on the optical characteristic of the mask 1400 and the optical characteristic of the aperture AP. The feature of the segment may be defined to identify the segment. In other words, the segment may be identified based on the feature of the segment.

In some example embodiments, a bias value corresponding to a specific segment may be obtained in advance in the preceding optical proximity correction, and a feature of the specific segment may be defined. In the following optical proximity correction, the feature of the specific segment may be identified first, then the bias value obtained in the preceding optical proximity correction may be allocated to the specific segment as an "initial" bias value, and most of iterations for obtaining a final bias value may be omitted in the following optical proximity correction (refer to FIG. 17).

Figures 11, 12:
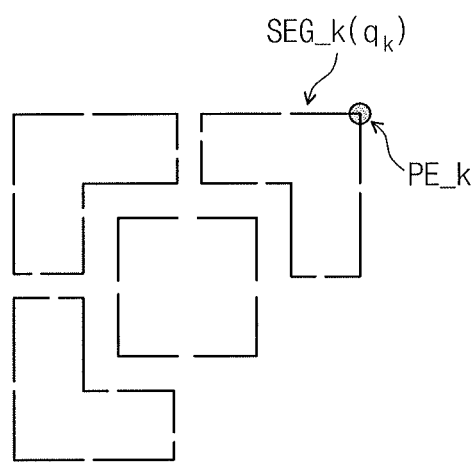
FIG. 11 illustrates a conceptual diagram for describing a method of defining a feature of a segment.
FIG. 12 illustrates a table of a correspondence relationship between a feature of a segment and a bias value.

FIG. 11 illustrates a conceptual diagram for describing a method of defining a feature of a segment.

As described above, an outline of a design layout may be divided into a plurality of segments during optical proximity correction. In the optical proximity correction, a feature of a segment may be defined based on an optical characteristic of the mask 1400 and an optical characteristic of the aperture AP. To aid understanding, a feature of a k-th segment SEG_k will be expressed by "$q_k$".

The segment may include an evaluation point. For example, the k-th segment SEG_k may include a k-th evaluation point PE_k. An evaluation point may be a point that is referred to define the feature of the segment and to obtain a bias value corresponding to the segment. The evaluation point may be selected to represent the segment. For example, the evaluation point may correspond to a middle point of the segment.

In order to define the feature of the k-th segment SEG_k, the optical characteristic of the mask 1400 and the optical characteristic of the aperture AP may be observed in view of the k-th evaluation point PE_k. For example, an optical characteristic, which may be generated by an i-th light source, observed in the k-th evaluation point PE_k may be mathematically modeled by "$p_{ki}$" in the following Equation 5.

$$p_{ki}=|O(x,y)*\Phi_i(x,y)|^2 \text{ at } PE\_k \qquad \text{[Equation 5]}$$

The above Equation 5 may be obtained based on the optical characteristic of the mask 1400 (i.e., an object function $O(x,y)$) and the optical characteristic of the aperture AP generated by the i-th light source (i.e., a point spread function $\Phi_i(x,y)$ corresponding to the i-th light source), that may be obtained at the k-th evaluation point PE-k. The photolithography system 1000 of FIG. 1 may include a plurality of light sources (e.g., three light sources L1, L2, and L3), and the feature "$q_k$" of the k-th segment SEG_k may be defined considering all the light sources by means of the following Equation 6.

$$q_k=[p_{k1},p_{k2},p_{k3}] \qquad \text{[Equation 6]}$$

When n light sources are employed instead of three light sources L1, L2, and L3, the feature "$q_k$" of the k-th segment SEG_k may be generalized according to the following Equation 7.

$$q_k=[p_{k1},p_{k2},\ldots,p_{kn}] \qquad \text{[Equation 7]}$$

In the above Equations 6 and 7, the feature "$q_k$" of the k-th segment SEG_k is expressed in the form of a vector. However, this is an example provided to aid understanding, and "$q_k$" will be expressed by other various forms.

To sum up, the feature of the segment may be defined based on an optical characteristic of the mask 1400 and optical characteristics of the aperture AP encountered by a plurality of light sources. The optical characteristic of the mask 1400 and the optical characteristics of the aperture AP may be referred to uniquely identify each of segments, and the optical characteristic of the mask 1400 and the optical characteristics of the aperture AP may be used to define the feature of the segment.

In some optical environments, the identical feature may be obtained for different kinds of segments, and in some example embodiments, an additional criterion may be further referred to uniquely identify each of a plurality of segments and to properly define the feature of the segment. For example, the additional criterion may include a length "$l_k$" of the k-th segment SEG_k. According to this example, the feature "$q_k$" of the k-th segment SEG_k may be expressed according to the following Equation 8.

$$q_k=[l_k,p_{k1},p_{k2},\ldots,p_{kn}] \qquad \text{[Equation 8]}$$

According to the above Equation 8, each of segments may be more accurately identified by referring to a geometric environment as well as an optical environment. In an embodiment, the additional criterion may include various other criteria to uniquely identify each segment.

FIG. 12 illustrates a table of a correspondence relationship between a feature of a segment and a bias value. To aid understanding, it will be assumed that m segments having different features are provided.

As described above, in the preceding optical proximity correction, bias values respectively corresponding to segments may be obtained, and a feature of each of the segments may be defined. For example, m final bias values (i.e., $b_1$ to $b_m$) respectively corresponding to m segments may be calculated during the preceding optical proximity correction. The feature of each of m segments may be defined. For example, the feature of the segment may be defined based on the above Equation 6 together with three light sources L1, L2, and L3 of FIG. 1.

Accordingly, a correspondence relationship between the feature and the bias value of each of the segments may be obtained during the preceding optical proximity correction. FIG. 12 illustrates an example of the correspondence relationship obtained in the preceding optical proximity correction.

In the following optical proximity correction, a feature of a specific segment may be obtained first, and then the bias value calculated in the preceding optical proximity correction may be allocated to the specific segment as an initial bias value. For example, in the following optical proximity correction, when a segment having a feature of "[$p_{11}$, $p_{12}$, $p_{13}$]" is provided, a bias value of "$b_1$" may be allocated to the segment as an initial bias value, iterations that are performed until the bias value "$b_1$" is obtained may be omitted from the following optical proximity correction, and a time taken for the following optical proximity correction may be significantly reduced.

In some cases, depending on an actual optical environment of the following optical proximity correction, the bias value of "$b_1$" may not exactly correspond to the segment having the feature of "[$p_{11}$, $p_{12}$, $p_{13}$]". As the bias value of "$b_1$" is provided as an initial bias value, a final bias value may be obtained within a short time, and speed and efficiency of the following optical proximity correction may be improved.

Figure 13:
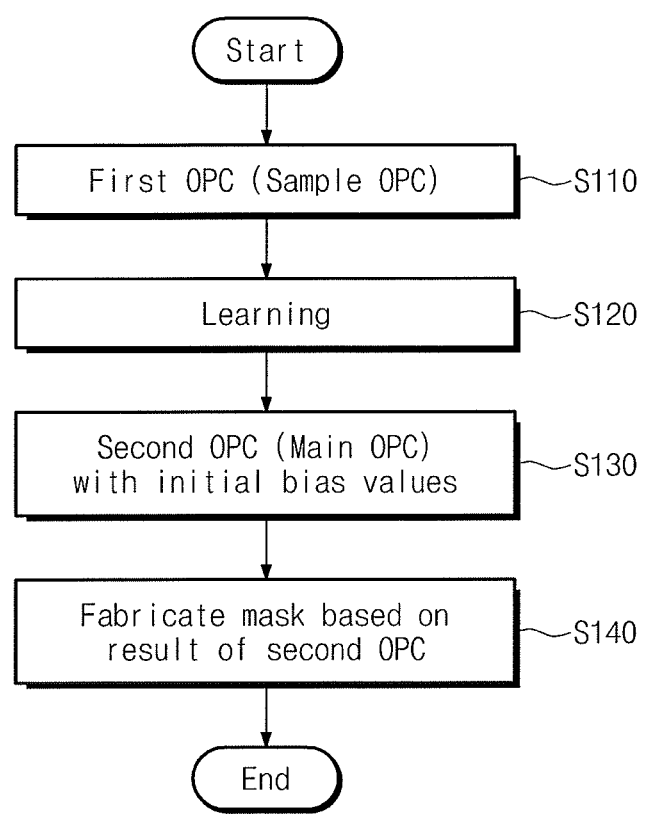
FIG. 13 illustrates a flowchart describing a process of performing optical proximity correction and fabricating a mask according to an example embodiment.

FIG. 13 illustrates a flowchart describing a process of performing optical proximity correction and fabricating a mask according to an example embodiment.

In operation S110, first optical proximity correction may be performed. The first optical proximity correction may be performed on first segments obtained by dividing an outline of a first design layout, and a bias value associated with each of the first segments (e.g., bias values $b_1$ to $b_m$ illustrated in FIG. 12) may be calculated.

The first optical proximity correction may be a "sample" optical proximity correction performed as preceding optical proximity correction. The first design layout may be a "sample" design layout designed to obtain a correspondence relationship illustrated in FIG. 12. For example, the first design layout may be properly designed such that sample segments (i.e., the first segments) having various features may be obtained. As the features of the first segments are variously obtained, information to be used in the following optical proximity correction may be properly obtained. Operation S110 will be further described with reference to FIG. 14.

In operation S120, a learning process may be performed. The feature of each of the first segments may be defined during the learning process. The feature of each of the first segments may be defined based on an optical characteristic of a mask corresponding to the first design layout and optical characteristics of an aperture that may be respectively generated by a plurality of light sources. The correspondence relationship such as a table illustrated in FIG. 12 may be obtained based on the defined features and the bias values obtained in operation S110. Operation S120 will be further described with reference to FIG. 15.

In operation S130, second optical proximity correction may be performed. The second optical proximity correction may be performed on second segments obtained by dividing an outline of a second design layout, and a bias value associated with each of the second segments may be calculated.

The second optical proximity correction may be a "main" optical proximity correction following the first optical proximity correction. The second design layout may be a normal design layout designed to actually fabricate a mask.

In some example embodiments, the second optical proximity correction may adopt initial bias values respectively corresponding to the second segments. Each of the initial bias values may be provided based on the correspondence relationship obtained in operation S120. Each of the initial bias value may be determined based on an optical characteristic of a mask corresponding to the second design layout and optical characteristics of an aperture that may be respectively generated by a plurality of light sources. A time taken for the second optical proximity correction may be reduced by initially biasing the second segments by the initial bias values.

The second optical proximity correction may be performed to calculate final bias values respectively corresponding to the second segments that are previously biased by the initial bias values. Operation S130 will be further described with reference to FIG. 16.

In operation S140, a mask may be fabricated. After the second optical proximity correction, the second design layout may be updated based on the final bias values calculated in operation S130. The mask may be fabricated to include image patterns corresponding to the updated second design layout. The mask fabricated in operation S140 may be used in the photolithography system 1000 of FIG. 1.

Figure 14:
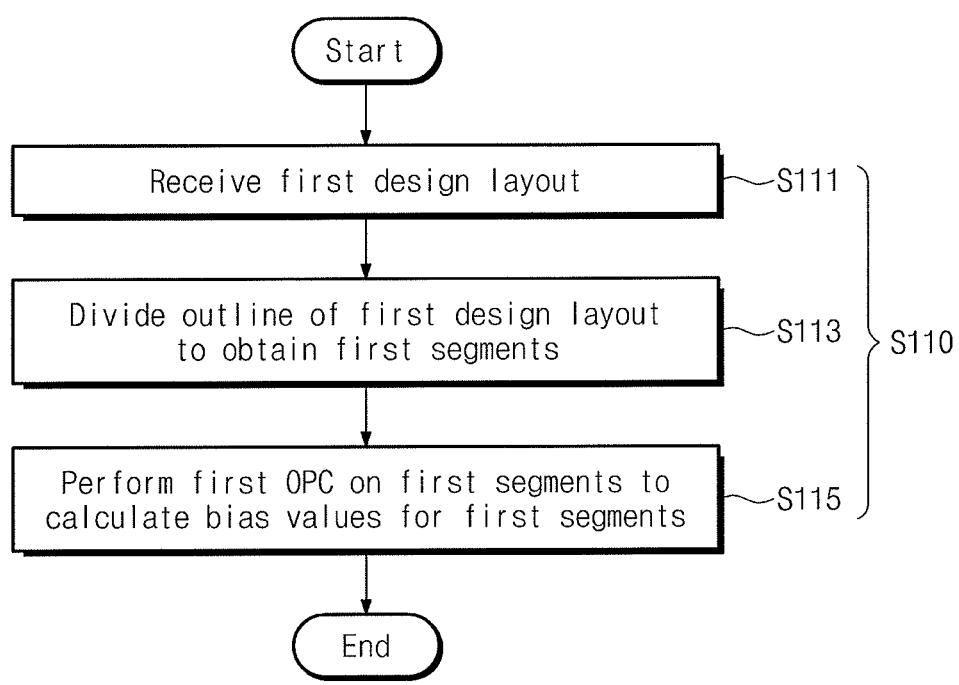
FIG. 14 illustrates a flowchart describing a process of performing sample optical proximity correction according to an example embodiment.

FIG. 14 illustrates a flowchart describing a process of performing sample optical proximity correction according to an example embodiment. The sample optical proximity correction may be performed as a first optical proximity correction in operation S110 of FIG. 13. Operation S110 may include operations S111 to S115.

In operation S111, a first design layout may be provided. The first design layout may be a sample design layout designed to obtain a correspondence relationship illustrated in FIG. 12. For example, a designer may input information associated with the first design layout to a device that may be used to perform optical proximity correction and fabricate a mask.

In operation S113, first segments may be obtained. The first segments may be obtained by dividing an outline of the first design layout. The process of dividing the outline of a layout has been described with reference to FIG. 3.

In operation S115, the first optical proximity correction may be performed. Bias values (e.g., bias values $b_1$ to $b_m$ illustrated in FIG. 12) respectively corresponding to the first segments may be calculated by performing the first optical proximity correction on the first segments. The process of biasing segments has been described with reference to FIG. 4.

The sample optical proximity correction may be performed to be identical or substantially identical to normal optical proximity correction. However, the sample optical proximity correction may not be performed to actually fabricate a mask. The sample optical proximity correction may be performed to provide the initial bias value to be used in main optical proximity correction that may be performed to actually fabricate a mask.

Figure 15:
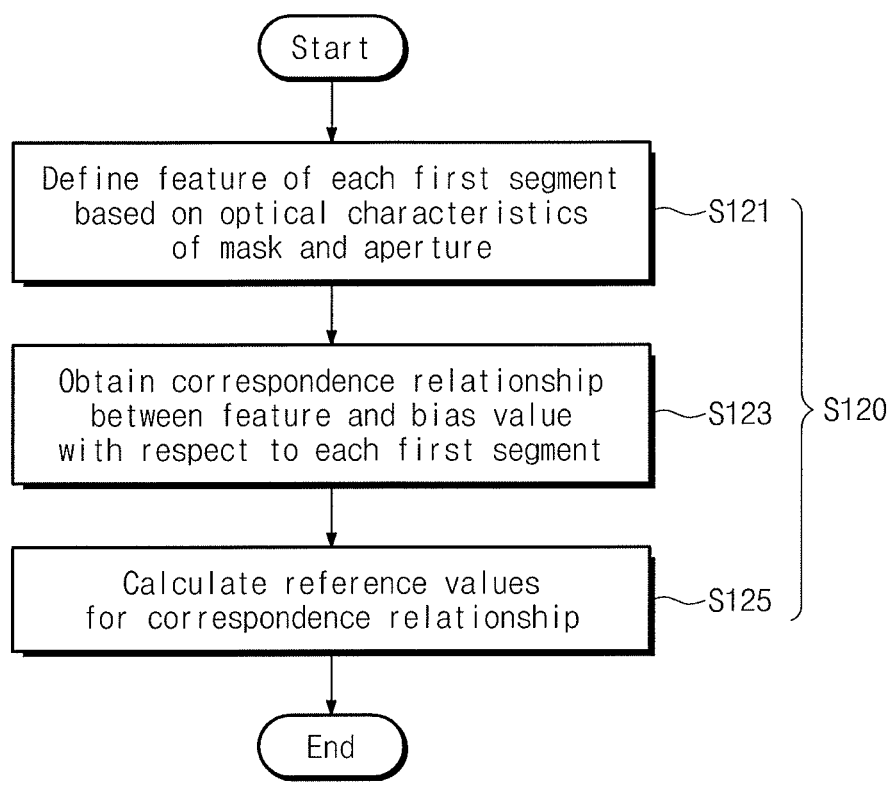
FIG. 15 illustrates a flowchart describing a process of learning a correspondence relationship between a feature of a segment and a bias value according to an example embodiment.

FIG. 15 illustrates a flowchart describing a process of learning a correspondence relationship between a feature of a segment and a bias value according to an example embodiment. A learning process may be performed in operation S120 of FIG. 13. Operation S120 may include operations S121 and S123.

In operation S121, a feature of each of first segments may be defined. The feature of each of the first segments may be defined based on an optical characteristic of a mask corresponding to the first design layout and optical characteristics of an aperture that may be respectively encountered by a plurality of light sources. The feature of the segment has been described with reference to FIG. 11.

In operation S123, a correspondence relationship such as a table illustrated in FIG. 12 may be obtained. This correspondence relationship may indicate a correspondence relationship between the feature of each of the first segments defined in operation S121 and a bias value associated with each of the first segments calculated in operation S115 of FIG. 14, and information associated with the correspondence relationship between a segment having a specific feature and a bias value being suitable for the segment may be obtained.

The correspondence relationship obtained in operation S123 may provide an initial bias value to be used in the following optical proximity correction. For example, the information associated with the correspondence relationship may be stored in a storage device or a memory device in the form of a look-up table. The stored information may be referred to obtain the initial bias value in the following optical proximity correction. For example, when a segment having a specific feature defined in the information of the correspondence relationship is provided in the following optical proximity correction, a bias value corresponding to the specific feature may be obtained as the initial bias value.

In some cases, the feature of the segment obtained in the following optical proximity correction may not be defined in the information of the correspondence relationship. In some example embodiments, a feature that is most similar to the feature of the segment obtained in the following optical proximity correction may be selected from among the features defined in the information of the correspondence relationship, and a bias value corresponding to the selected feature may be obtained as the initial bias value.

In some example embodiments, operation S120 may further include operation S125. In operation S125, "reference values" may be calculated to handle the case where a segment having a feature that is not defined in the information of the correspondence relationship is provided.

The reference values may indicate a relationship between the features of the first segments and the bias values associated with the first segments. For example, the reference values may be calculated by performing linear regression analysis or neural network analysis.

To aid understanding, the process of calculating the reference values by means of a concept of linear regression analysis will be described. In the following description, the reference value will be expressed by "$c_i$". Herein, "i" may be an index denoting a light source included in a photolithography system. For example, when m first segments and three light sources L1, L2, and L3 are provided as described with reference to FIG. 12, Equation 9 may be expressed as follows.

$$\begin{pmatrix} p_{11} & p_{12} & p_{13} \\ p_{21} & p_{22} & p_{23} \\ \vdots & \vdots & \vdots \\ p_{m1} & p_{m2} & p_{m3} \end{pmatrix} \begin{pmatrix} c_1 \\ c_2 \\ c_3 \end{pmatrix} = \begin{pmatrix} b_1 \\ b_2 \\ \vdots \\ b_m \end{pmatrix} \quad \text{[Equation 9]}$$

In the above Equation 9, the reference values "$c_1$", "$c_2$", and "$c_3$" may be used to calculate bias values associated with the first segments from the features of the first segments based on the correspondence relationship illustrated in FIG. 12. These reference values "$c_1$", "$c_2$", and "$c_3$" may be obtained according to the following Equation 10 based on the correspondence relationship illustrated in FIG. 12.

$$\begin{pmatrix} c_1 \\ c_2 \\ c_3 \end{pmatrix} = \begin{pmatrix} p_{11} & p_{12} & p_{13} \\ p_{21} & p_{22} & p_{23} \\ \vdots & \vdots & \vdots \\ p_{m1} & p_{m2} & p_{m3} \end{pmatrix}^{-1} \begin{pmatrix} b_1 \\ b_2 \\ \vdots \\ b_m \end{pmatrix} \quad \text{[Equation 10]}$$

The reference values "$c_1$", "$c_2$", and "$c_3$" may be used to deal with the case where a segment having a feature that is not defined in the information of the correspondence relationship is provided. For example, when a segment having a feature of "$[p_{z1}, p_{z2}, p_{z3}]$" that is not defined in the correspondence relationship illustrated in FIG. 12 is provided during the following optical proximity correction, a bias value (i.e., an initial bias value) "$b_z$" corresponding to the segment may be calculated according to the following Equation 11.

$$(p_{z1}\, p_{z2}\, p_{z3}) \begin{pmatrix} c_1 \\ c_2 \\ c_3 \end{pmatrix} = b_z \quad \text{[Equation 11]}$$

The bias value "$b_z$" calculated according to the above Equation 11 may be provided as an initial bias value for the segment having the feature of "$[p_{z1}, p_{z2}, p_{z3}]$" in the following optical proximity correction. For example, in some example embodiments, the initial bias value used in the following optical proximity correction may be provided based on the feature of the segment, which is obtained by dividing an outline of a design layout provided for the following optical proximity correction, and the reference values.

When n light sources are employed instead of three light sources L1, L2, and L3, the above Equation 9 may be generalized as the following Equation 12.

$$\begin{pmatrix} p_{11} & p_{12} & \cdots & p_{1n} \\ p_{21} & p_{22} & \cdots & p_{2n} \\ \vdots & \vdots & \ddots & \vdots \\ p_{m1} & p_{m2} & \cdots & p_{mn} \end{pmatrix} \begin{pmatrix} c_1 \\ c_2 \\ \vdots \\ c_n \end{pmatrix} = \begin{pmatrix} b_1 \\ b_2 \\ \vdots \\ b_m \end{pmatrix}, \quad \text{[Equation 12]}$$

optical characteristics generated by all of n light sources may be used to define the feature of the segment.

In some cases, some of n light sources may relatively greatly contribute to defining the feature of the segment, and the other light sources may relatively less contribute to defining the feature of the segment. For example, a light source emitting a light having weak intensity or a light source spatially located in an outward region may relatively less contribute to defining the feature of the segment.

Complexity of operation may be reduced when the number of optical characteristics to be referred is reduced, and in order to define the feature of the segment, it may be efficient to use some optical characteristics respectively generated by light sources that relatively greatly contribute to defining the feature of the segment, instead of using all the optical characteristics respectively generated by all of n light sources.

Accordingly, in some example embodiments, the feature of the segment may be defined based on a selected number of optical characteristics from among the optical characteristics of the aperture that may be respectively generated by a plurality of light sources. In these example embodiments, the selected number of optical characteristics may more greatly contribute to defining the feature of the segment than the other optical characteristics. Herein, the "selected number" may be changed considering at least one of accuracy and speed of optical proximity correction. For example, when accuracy of optical proximity correction is more important than speed, the selected number may be set to have a large value. When speed of optical proximity correction is more important than accuracy, the selected number may be set to have a small value.

In some example embodiments, the optical characteristics of the aperture that more greatly contribute to defining the feature of the segment may be selected based on a value of coefficient "$\lambda_i$" described with reference to the above Equation 4. For example, when an optical characteristic of the aperture that may be generated by an i-th light source more greatly affects defining the feature of the segment, coefficient "$\lambda_i$" corresponding to the i-th light source may have a relatively large value, and the optical characteristic of the aperture corresponding to the coefficient "$\lambda_i$" having a large value may be selected to define the feature of the segment. In some example embodiments, transformation of a calculation space by means of the SVD technique may be properly performed such that the optical characteristic to be selected corresponds to coefficient "$\lambda_i$" having a large value.

An operation using a concept of linear regression analysis has been described in descriptions for the Equations 9 to 12. Other techniques other than linear regression analysis may be applied similarly to the above descriptions. For brevity of the description, detailed descriptions will be omitted below.

Figure 16:
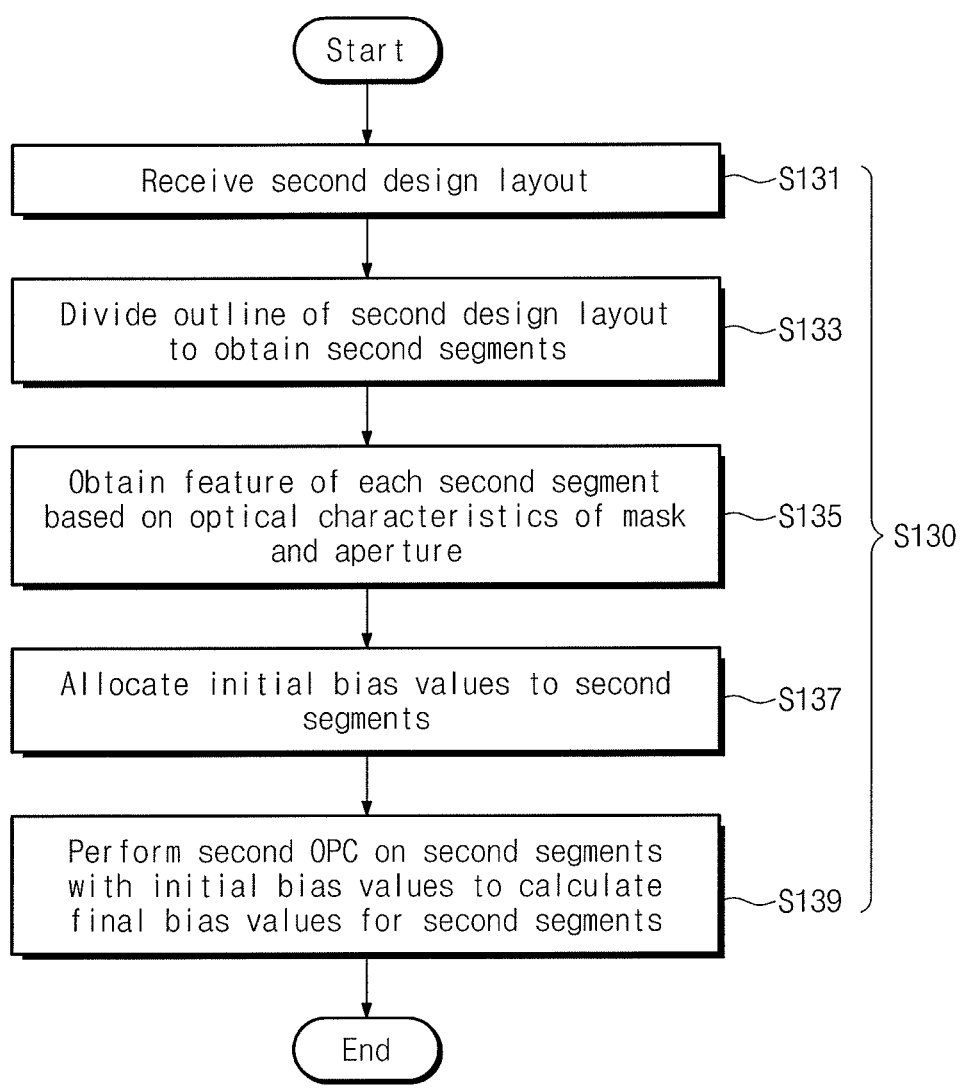
FIG. 16 illustrates a flowchart describing a process of performing main optical proximity correction according to an example embodiment.

FIG. 16 illustrates a flowchart describing a process of performing main optical proximity correction according to an example embodiment. The main optical proximity correction may be performed as second optical proximity correction in operation S130 of FIG. 13. Operation S130 may include operations S131 to S139.

In operation S131, a second design layout may be provided. The second design layout may be a normal design layout designed to actually fabricate a mask. For example, a designer may input information associated with the second design layout to a device that may be used to perform optical proximity correction and fabricate a mask.

In operation S133, second segments may be obtained. The second segments may be obtained by dividing an outline of the second design layout. The process of dividing an outline of a layout has been described with reference to FIG. 3.

In operation S135, a feature of each of the second segments may be obtained. The feature of each of the second segments may be defined based on an optical characteristic of a mask corresponding to the second design layout and optical characteristics of an aperture that may be respectively generated by a plurality of light sources. The feature of the segment has been described with reference to FIG. 11.

In operation S137, an initial bias values may be allocated to some or all of the second segments. The initial bias values may be provided based on a correspondence relationship obtained in operation S123 of FIG. 15 and/or reference values calculated in operation S125 of FIG. 15. Herein, the initial bias values may be determined to respectively correspond to the features of the second segments. Calculating the initial bias value has been described with reference to FIG. 15. A segment to which the initial bias value may be allocated may be initially biased by the initial bias value.

In operation S139, second optical proximity correction may be performed. In some example embodiments, the second optical proximity correction may be performed on the second segments including the segments that may be biased in operation S137. Final bias values respectively corresponding to the second segments may be calculated by performing the second optical proximity correction. The process of biasing segments has been described with reference to FIG. 4.

Afterwards, the second design layout may be updated based on the final bias values calculated as a result of the second optical proximity correction in operation S140 of FIG. 13. A mask corresponding to the updated second design layout may be fabricated.

In some example embodiments, the result of the second optical proximity correction may be used (e.g., fed back) to update the correspondence relationship obtained in operation S123 of FIG. 15. For example, a learning process may be further performed based on the correspondence relationship between the final bias values calculated in operation S139 and the features obtained in operation S135. According to these example embodiments, reliability of information associated with the correspondence relationship between a feature of a segment and a bias value may be improved.

FIG. 17 illustrates a conceptual diagram for describing an effect obtained according to an example embodiment.

As described with reference to FIGS. 1 to 4, a target layout to be printed on a wafer may be provided as an initial design layout IDL. As optical proximity correction is performed on the initial design layout IDL, segments obtained by dividing a design layout may be biased and a design layout may be gradually updated.

For example, the initial design layout IDL may be updated to a first design layout DL_1 through a first bias operation, and the first design layout DL_1 may be updated to a second design layout DL_2 through a second bias operation. After an f-th bias operation is performed through multiple bias operations, a finally updated design layout FDL may be obtained. The finally updated design layout FDL may correspond to image patterns to be included in a mask to print the target layout on a wafer.

Iterations may be repeated many times to obtain the finally updated design layout FDL, and the optical proximity correction may take a lot of time. According to the example embodiment, most of iterations may be omitted based on the initial bias value. For example, performing 'e' times of bias operations may be omitted by directly updating the initial design layout IDL to an e-th design layout DL_e by means of the initial bias value, and according to the example embodiment, speed and efficiency of the optical proximity correction may be improved.

Figure 18:
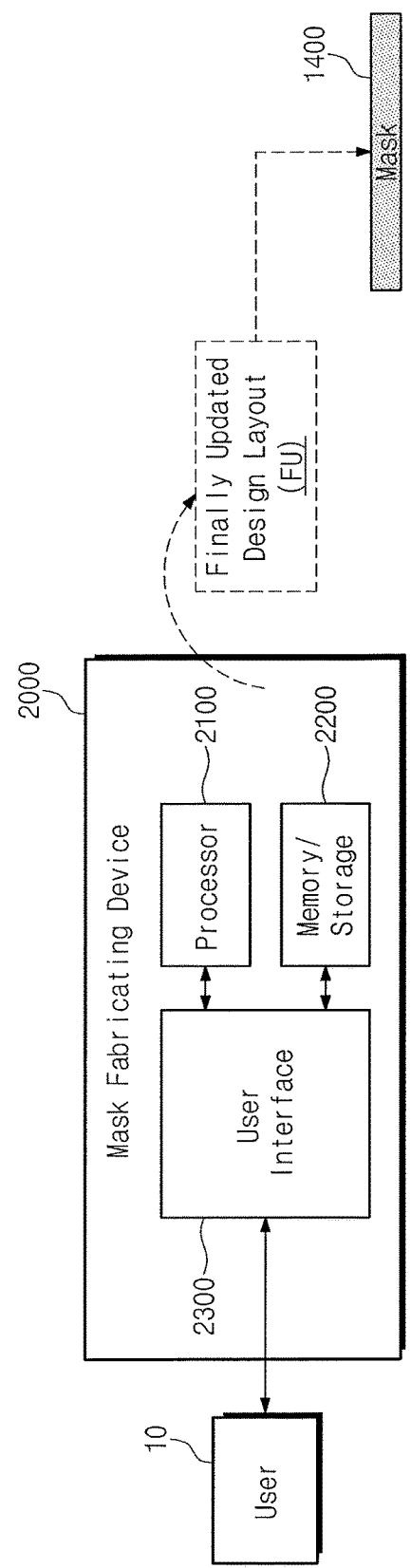
FIG. 18 illustrates a block diagram of a mask fabricating device that operates according to an example embodiment.

FIG. 18 illustrates a block diagram of a mask fabricating device that operates according to an example embodiment. Referring to FIG. 18, a mask fabricating device 2000 may include a processor 2100, a memory/storage 2200, and a user interface 2300. The mask fabricating device 2000 may be used to perform optical proximity correction according to the example embodiments described with reference to FIGS. 2 to 17 and to fabricate the mask 1400.

The processor 2100 may include at least one of a general-purpose processor, and a special-purposed processor such as a workstation processor. The processor 2100 may perform various arithmetic operations and/or logical operations to perform operations (e.g., performing, obtaining, dividing, allocating, calculating, updating, and so on) described with reference to FIGS. 2 to 17. The processor 2100 may include one or more processor cores. For example, the processor core of the processor 2100 may include a special-purposed logic circuit (e.g., field programmable gate array (FPGA) or application specific integrated chips (ASICs)).

The memory/storage 2200 may temporarily or semi-permanently store data processed or to be processed by the processor 2100. The memory/storage 2200 may include at least one of a volatile memory such as, for example, dynamic random access memory (DRAM), static RAM (SRAM), or synchronous DRAM (SDRAM), and/or a non-volatile memory such as, for example, flash memory, phase-change RAM (PRAM), magneto-resistive RAM (MRAM), resistive RAM (ReRAM), or ferroelectric RAM (FRAM).

According to an operation of each of the processor 2100 and the memory/storage 2200, the example embodiments described with reference to FIGS. 2 to 17 may be implemented. For example, according to an operation of each of the processor 2100 and the memory/storage 2200, optical proximity correction may be performed on segments obtained by dividing a design layout, and a bias value corresponding to each of the segments may be calculated. A feature of the segment may be defined, information of a correspondence relationship such as a table illustrated in FIG. 12 may be stored, an initial bias value may be allocated to the segment based on the corresponding relationship, and the mask fabricating device 2000 may be used to fabricate the mask 1400 according to an operation of each of the processor 2100 and the memory/storage 2200.

The mask fabricating device 2000 may execute software according to an operation of each of the processor 2100 and the memory/storage 2200. For example, the software may include an operating system (OS) and/or one or more applications. The OS may provide one or more services to an application, and may operate as an arbitrator between an application and components of the mask fabricating device 2000. For example, the application may include design program software used to design a layout and perform optical proximity correction according to the example embodiments described with reference to FIGS. 2 to 17.

The user interface 2300 may operate to provide a result obtained by operations of the processor 2100 and the memory/storage 2200 to a user 10. The user interface 2300 may be used to receive various data (e.g., data associated with a design layout) from the user 10. For example, the user 10 may be a designer of the mask 1400 and a layout. For example, the user interface 2300 may include input/output interfaces such as, for example, a display device, a speaker, a keyboard, and/or a mouse.

The mask fabricating device 2000 may output a finally updated design layout FU according to the example embodiments described with reference to FIGS. 2 to 17. The mask fabricating device 2000 may fabricate the mask 1400 based on the finally updated design layout FU. The mask 1400 may be fabricated to include image patterns corresponding to the finally updated design layout FU. The mask 1400 may be used to print circuit patterns on the wafer WF in the photolithography system 1000 illustrated in FIG. 1.

According to the example embodiments, the optical proximity correction performed by the mask fabricating device 2000 may be completed within a short time, and speed and efficiency of the optical proximity correction may be improved.

Figure 19:
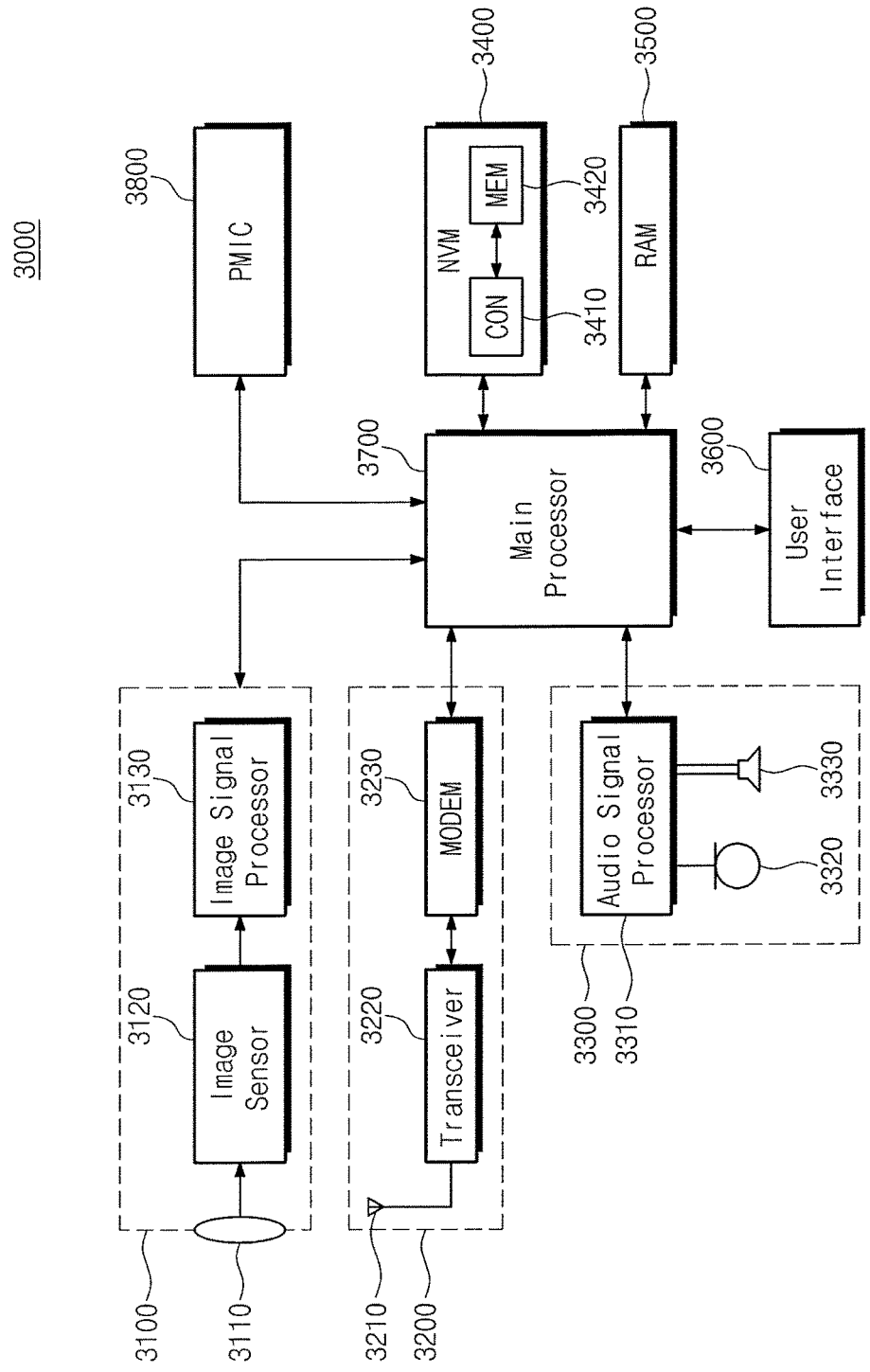
FIG. 19 illustrates a block diagram of a mobile electronic device including a chip and/or a circuit that is implemented using a mask fabricated according to an example embodiment.

FIG. 19 illustrates a block diagram of a mobile electronic device including a chip and/or a circuit that is implemented using a mask fabricated according to an example embodiment. Referring to FIG. 19, a mobile electronic device 3000 may include an image processor 3100, a wireless communication block 3200, an audio processor 3300, a nonvolatile memory 3400, a RAM 3500, a user interface 3600, a main processor 3700, and a power management integrated circuit (PMIC) 3800. In some example embodiments, the mobile electronic device 3000 may be one of, for example, a mobile terminal, a portable digital assistant (PDA), a personal media player (PMP), a digital camera, a smartphone, a notebook computer, a tablet computer, or a wearable device.

The image processor 3100 may receive light through a lens 3110. An image sensor 3120 and an image signal processor 3130 included in the image processor 3100 may generate an image based on the received light.

The wireless communication block 3200 may include an antenna 3210, a transceiver 3220, and a modulator/demodulator (MODEM) 3230. The wireless communication block 3200 may communicate with an external entity located outside the mobile electronic device 3000 in compliance with various wireless communication protocols, such as, for example, long term evolution (LTE), worldwide interoperability for microwave access (WiMax), global system for mobile communication (GSM), code division multiple access (CDMA), Bluetooth, near field communication (NFC), wireless fidelity (Wi-Fi), and/or radio frequency identification (RFID).

The audio processor 3300 may process an audio signal by means of an audio signal processor 3310. The audio processor 3300 may receive an audio input through a microphone 3320 or may provide an audio output through a speaker 3330.

The nonvolatile memory device 3400 may store data regardless of power supply. In some example embodiments, the nonvolatile memory 3400 may include one or more of, for example, flash memory, PRAM, MRAM, ReRAM, and/or FRAM. Under control of a memory controller 3410, a memory device 3420 may store and output data.

The RAM 3500 may store data used in an operation of the mobile electronic device 3000. For example, the RAM 3500 may operate as, e.g., a working memory, an operation memory, or a buffer memory, of the mobile electronic device 3000. The RAM 3500 may temporarily store data processed or to be processed by the main processor 3700.

The user interface 3600 may arbitrate an interfacing between a user and the mobile electronic device 3000 under control of the main processor 3700. For example, the user interface 3600 may include an input interface such as, for example, a keyboard, a keypad, a button, a touch panel, a touch screen, a touch pad, a touch ball, a camera, a gyroscope sensor, and/or a vibration sensor. The user interface 3600 may include an output interface such as, for example, a display device and/or a motor. For example, the display device may include one or more of a liquid crystal display (LCD), a light emitting diode (LED) display, an organic LED (OLED) display, and an active matrix OLED (AMOLED) display.

The main processor 3700 may control the overall operations of the mobile electronic device 3000. The image processor 3100, the wireless communication block 3200, the audio processor 3300, the nonvolatile memory 3400, and the RAM 3500 may perform a user command provided through the user interface 3600 under control of the main processor 3700. In addition, the image processor 3100, the wireless communication block 3200, the audio processor 3300, the nonvolatile memory 3400, and the RAM 3500 may provide a service to a user through the user interface 3600 under control of the main processor 3700. The main processor 3700 may be implemented with a system-on-chip (SoC). For example, the main processor 3700 may include an application processor.

The PMIC 3800 may manage power used in an operation of the mobile electronic device 3000. In some example embodiments, the PMIC 3800 may convert power provided from a battery or an external power. The PMIC 3800 may provide the converted power to other components of the mobile electronic device 3000.

Each of the image processor 3100, the wireless communication block 3200, the audio processor 3300, the nonvolatile memory 3400, the RAM 3500, the user interface 3600, the main processor 3700, and the PMIC 3800 may include a circuit or device implemented using a mask that is fabricated according to the example embodiments of the present disclosure described with reference to FIGS. 2 to 18. A circuit included in each of the image processor 3100, the wireless communication block 3200, the audio processor 3300, the nonvolatile memory 3400, the RAM 3500, the user interface 3600, the main processor 3700, and the PMIC 3800 may be implemented using a mask that is fabricated by the optical proximity correction based on the example embodiments of the present disclosure.

A circuit implemented using a mask fabricated according to an embodiment may be mounted using various kinds of semiconductor packages. For example, a circuit implemented using a mask fabricated according to an example embodiment of the present disclosure may be mounted using various kinds of semiconductor packages, such as, for example, package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), metric quad flat pack (MQFP), small outline integrated circuit (SOIC), shrink small outline package (SSOP), thin small outline package (TSOP), thin quad flat pack (TQFP), system in package (SIP), multi-chip package (MCP), wafer-level fabricated package (WFP), and/or wafer-level processed stack package (WSP).

According to the example embodiments of the present disclosure, segments of a design layout may be previously biased to be close to the final result, and the number of occurrences of the iterations which takes a lot of time in an optical proximity correction may be reduced, and a speed and an efficiency of the optical proximity correction may be improved.

By way of summation and review, chips or circuits implemented with semiconductor elements may be obtained by a photolithography process. The photolithography process may be used to print a layout on a semiconductor wafer (e.g., silicon or GaAs wafer). A layout on a wafer may include circuit patterns. These circuit patterns may be designed to perform specific functions, respectively.

A mask may be used to print a layout on a wafer in the photolithography process. The mask may include a transparent region and an opaque region. The transparent region may be formed by etching a metal layer on the mask, and light may pass through the transparent region. Light may not pass through the opaque region. The transparent region and the opaque region may form image patterns used to print a layout on a wafer. Light emitted from a light source may be projected onto the wafer through the image patterns of the mask, and a layout including the circuit patterns may be printed on a wafer.

As integration of the semiconductor process increases, a distance between the image patterns of the mask may become closer, and a width of the transparent region may become narrower. Because of such "proximity", interference and diffraction of light occur, and a distorted layout different from a desired layout may be printed on a wafer.

To prevent distortion of a layout, a resolution enhancement technology such as "optical proximity correction" may be used. According to the optical proximity correction, a degree of distortion such as interference and diffraction of light may be estimated in advance. Image patterns to be formed on a mask may be biased in advance, based on the estimated result, and the desired layout may be printed on a wafer.

Some example embodiments of the present disclosure may provide an "initial bias value" for "optical proximity correction". To obtain the initial bias value, a feature of each of segments obtained by dividing an outline of a design layout may be defined based on an optical environment. After the initial bias value is allocated to each of the segments according to the feature defined based on the optical environment, the optical proximity correction may be performed. A mask may be fabricated based on a result of the optical proximity correction.

The present disclosure relates to a method of fabricating a mask that may include image patterns used to print a layout on a wafer, and a method of providing an initial bias value for optical proximity correction that may be performed to obtain the image patterns.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of fabricating a mask, the method comprising:

performing first optical proximity correction on first segments, each of the first segments having at least two different features, at least one of the first segments being a two-dimensional open figure, the first segments being obtained by dividing an outline of a first design layout;

obtaining a correspondence relationship between a feature of each of the first segments and a bias value associated with each of the first segments, the feature of each of the first segments being defined based on an optical characteristic of a mask corresponding to the first design layout and optical characteristics of an aperture that are respectively generated by a plurality of light sources, the bias value associated with each of the first segments being calculated by the first optical proximity correction;

performing second optical proximity correction on second segments, the second segments being obtained by dividing an outline of a second design layout;

updating the second design layout based on a result of the second optical proximity correction; and fabricating a mask corresponding to the updated second design layout, performing the second optical proximity correction including:

obtaining a feature of each of the second segments, based on an optical characteristic of a mask corresponding to the second design layout and optical characteristics of the aperture that are respectively generated by the plurality of light sources; and allocating a bias value, that is obtained to correspond to the feature of each of the second segments based on the correspondence relationship between the bias values and the features of the first segments, to each of the second segments as an initial bias value, wherein a number of the different features is a number of the plurality of light sources.

2. The method as claimed in claim 1, wherein:

the first design layout is a sample design layout designed to obtain the correspondence relationship, and the second design layout is a normal design layout designed to fabricate the mask corresponding to the updated second design layout.

3. The method as claimed in claim 1, wherein the feature of each of the first segments is defined based on a basis intensity that is calculated with respect to an evaluation point of a respective first segment.

4. The method as claimed in claim 3, wherein the basis intensity is calculated by squaring a convolution of an object function and a point spread function with respect to the evaluation point of the respective first segment, the object function indicating the optical characteristic of the mask corresponding to the first design layout in a space domain, the point spread function being obtained by performing a Fourier transform on a pupil function, the pupil function indicating each of the optical characteristics of the aperture that are respectively generated by the plurality of light sources in the space domain.

5. A method of fabricating a mask, the method comprising:

allocating initial bias values that correspond to some or all of a plurality of segments to the some or all of the plurality of segments, the plurality of segments being obtained by dividing an outline of a design layout and at least one of the plurality of segments being a two-dimensional open figure;

performing optical proximity correction on the plurality of segments where the initial bias values are allocated;

updating the design layout based on a result of the optical proximity correction; and fabricating a mask corresponding to the updated design layout, the initial bias values being respectively determined according to at least two different features of each of the plurality of segments, the features of the plurality of segments being defined based on an optical characteristic of a mask corresponding to the design layout and optical characteristics of an aperture that are respectively generated by a plurality of light sources, wherein a number of the different features is a number of the plurality of light sources.

6. The method as claimed in claim 5, wherein a feature of each of the plurality of segments is defined based on a basis intensity that is calculated with respect to an evaluation point of a respective segment.

7. The method as claimed in claim 6, wherein the basis intensity is calculated by squaring a convolution of an object function and a point spread function with respect to the evaluation point of the respective segment, the object function indicating the optical characteristic of the mask corresponding to the design layout in a space domain, the point spread function being obtained by performing a Fourier transform on a pupil function, the pupil function indicating each of the optical characteristics of the aperture that are generated by the plurality of light sources in the space domain.

8. The method as claimed in claim 5, wherein each of the initial bias values is provided based on a correspondence relationship between a feature of each of a plurality of sample segments and a bias value associated with each of the plurality of sample segments, the plurality of sample segments being obtained by dividing an outline of a sample design layout, the bias value associated with each of the plurality of sample segments being calculated by sample optical proximity correction that is performed on the plurality of sample segments.

9. The method as claimed in claim 8, wherein the feature of each of the plurality of sample segments is defined based on an optical characteristic of a mask corresponding to the sample design layout and the optical characteristics of the aperture that are respectively generated by the plurality of light sources.

10. The method as claimed in claim 5, wherein:

allocating the initial bias values includes biasing the some or all of the plurality of segments by the initial bias values, respectively, and performing the optical proximity correction includes performing the optical proximity correction on the plurality of segments that includes the biased segments.

11. A method of fabricating a mask, the method comprising:

performing sample optical proximity correction on a plurality of segments, each of the plurality of segments having at least two different features, the plurality of segments being obtained by dividing an outline of a sample design layout and at least one of the segments being a two-dimensional open figure;

defining a feature of each of the plurality of segments, based on an optical characteristic of a mask corresponding to the sample design layout and optical characteristics of an aperture that are respectively generated by a plurality of light sources;

obtaining a correspondence relationship between the feature of each of the plurality of segments and a bias value associated with each of the plurality of segments, the bias value being calculated by the sample optical proximity correction, the initial bias value being provided for segments of the design layout based on the correspondence relationship between the bias values and the features of the segments of the design layout; and manufacturing the mask based on the initial bias values, wherein a number of the different features is a number of the plurality of light sources.

12. The method as claimed in claim 11, further comprising:
calculating reference values that are used to calculate bias values associated with the plurality of segments from features of the plurality of segments, based on the correspondence relationship.

13. The method as claimed in claim 12, wherein the reference values are calculated by performing linear regression analysis or neural network analysis on a relationship between the features of the plurality of segments and the bias values associated with the plurality of segments.

14. The method as claimed in claim 12, wherein the initial bias value is provided based on a feature of a target segment and the reference values, the target segment being obtained by dividing an outline of the design layout that is provided for the optical proximity correction.

15. The method as claimed in claim 14, wherein the feature of the target segment is defined based on an optical characteristic of a mask corresponding to the design layout and the optical characteristics of the aperture that are respectively generated by the plurality of light sources.

16. The method as claimed in claim 11, wherein:
defining the feature of each of the plurality of segments includes defining the feature of each of the plurality of segments based on a selected number of optical characteristics from among the optical characteristics of the aperture that are generated by the plurality of light sources, and
a contribution of the selected number of optical characteristics to defining the feature of each of the plurality of segments is greater than a contribution of optical characteristics other than the selected number of optical characteristics.

17. The method as claimed in claim 16, wherein the selected number is changed considering at least one of accuracy and speed associated with the optical proximity correction.

18. The method as claimed in claim 11, wherein the feature of each of the plurality of segments is defined further based on an additional criterion that is used to identify each of the plurality of segments.

19. The method as claimed in claim 18, wherein the additional criterion includes a length of each of the plurality of segments.

20. The method as claimed in claim 11, further comprising:
updating the correspondence relationship based on a final bias value that is obtained as a result of the optical proximity correction.

* * * * *